(12) United States Patent
Fujimori et al.

(10) Patent No.: US 6,683,244 B2
(45) Date of Patent: Jan. 27, 2004

(54) PHOTOELECTRIC CONVERSION ELEMENT

(75) Inventors: Yuji Fujimori, Suwa (JP); Tsutomu Miyamoto, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 51 days.

(21) Appl. No.: 10/002,112

(22) Filed: Dec. 5, 2001

(65) Prior Publication Data

US 2002/0108649 A1 Aug. 15, 2002

(30) Foreign Application Priority Data

| Dec. 7, 2000 | (JP) | 2000-373590 |
| May 30, 2001 | (JP) | 2001-163412 |
| Sep. 13, 2001 | (JP) | 2001-278807 |
| Nov. 12, 2001 | (JP) | 2001-346708 |

(51) Int. Cl.$^7$ .......... H01L 51/20; H01L 31/04; H01G 9/20

(52) U.S. Cl. .......... 136/263; 136/256; 136/252; 429/111; 257/431; 257/43; 257/40

(58) Field of Search .......... 136/263, 256, 136/252; 429/111; 257/431, 43, 40

(56) References Cited

U.S. PATENT DOCUMENTS

| 6,291,763 B1 | * | 9/2001 | Nakamura | 136/256 |
| 6,376,765 B1 | * | 4/2002 | Wariishi et al. | 136/263 |
| 6,559,375 B1 | | 5/2003 | Meissner et al. | 136/263 |
| 6,586,670 B2 | * | 7/2003 | Yoshikawa | 136/263 |
| 2002/0117201 A1 | * | 8/2002 | Nelles et al. | 136/263 |
| 2003/0062082 A1 | * | 4/2003 | Miteva et al. | 136/263 |

FOREIGN PATENT DOCUMENTS

| DE | 199 27 981 A1 | 1/2001 |
| DE | 19927981 A1 * | 1/2001 |
| EP | 0 924 724 A2 | 6/1999 |
| JP | 01-220380 | 9/1989 |
| JP | 06-051113 | 2/1994 |
| WO | WO 91/16719 | 10/1991 |
| WO | WO 93/20569 | 10/1993 |
| WO | WO 00/33396 | 6/2000 |

OTHER PUBLICATIONS

Kavan et al, "Highly efficient semiconducting TiO2 photoelectrodes prepared by aerosol pyrolysis," Electrochim. Acta, vol. 40, pp. 643–652 (1995).*

B. O'Regan et al., "Electrodeposited Nanocomposite N–P Heterojunctions for Solid–State Dye–Sensitized Photovoltaics", Advanced Materials, VCH Verlagsgesellschaft, Weinheim, DE., vol. 12, No. 17, Sep. 1, 2000, pp. 1263–1267.

K. Tennakone et al., "A Solid–State Photovoltaic Cell Sensitized with a Ruthenium Bipyridyl Complex", Journal of Physics D. Applied Physics, IOP Publishing, Bristol, GB, vol. 31, No. 12, Jun. 21, 1998, pp. 1492–1496.

U. Bach et al., "Solid–State Dye–Sensitized Mesoporous $TiO_2$ Solar Cells with High Photon–to–Electron Conversion Efficiencies", Nature, MacMillan Journals, Ltd., London, GB, vol. 395, Oct. 8, 1998, pp. 583–585.

(List continued on next page.)

Primary Examiner—Alan Diamond
(74) Attorney, Agent, or Firm—Oliff & Berridge, PLC

(57) ABSTRACT

A solar cell including a first electrode, a second electrode arranged opposite to the first electrode, an electron transport layer arranged between the first electrode and the second electrode, a dye layer D which is in contact with the electron transport layer, a hole transport layer arranged between the electron transport layer and the second electrode and being in contact with the dye layer D, and a barrier layer, and these elements are provided on a substrate. The barrier layer prevents or suppresses short-circuit between the first electrode and the hole transport layer. The porosity of the barrier layer is made smaller than that of the electron transport layer. The barrier layer is formed into a film-like shape and arranged between the first electrode and the electron transport layer. The solar cell can accomplish excellent photoelectric conversion efficiency by the provision of such a barrier layer.

45 Claims, 9 Drawing Sheets-

Light (Sun Light)

OTHER PUBLICATIONS

"A Solid–State Photovoltaic Cell Sensitized With A Ruthenium Bipyridyl Complex"; K. Tennakone et al.; J. Phys. D: Appl. Phys. 31; Feb. 12, 1998; pp. 1492–1496.

"Sensitization of Nano–Porous Films of $TiO_2$ With Santalin (Red Sandalwood Pigment) and Construction of Dye–Sensitized Solid State Photovoltaic Cells"; K. Tennakone et al.; Journal of Photochemistry and Photobiology A: Chemistry 117; Jul. 9, 1998; pp. 137–142.

"Highly Stable Dye–Sensitized Solid–State Solar Cell Wth the Semiconductor $4CuBr \ 3S(C_4H_9)_2$ as the Hole Collector"; K. Tennakone et al.; 2000 American Institute of Physics, Applied Physics Letters; vol. 77, No. 15; Aug. 1, 2000; pp. 2367–2369.

"A Dye–Sensitized Nano–Porous Solid–State Photovoltaic Cell"; K.Tennakone et al; Semicond. Sci. Technol. 10; Aug. 22, 1995; pp. 1689–1693.

"The Photostability of Dye–Sensitized Solid State Potovoltaic Cells: Factors Determining the Stability of the Pigment in a Nanoporous $n-TiO_s$/cyaniding/p–CuI Cell"; K Tennakone et al.; Semicond. Sci. Technol. 12; Sep. 13, 1996; pp. 128–132.

* cited by examiner

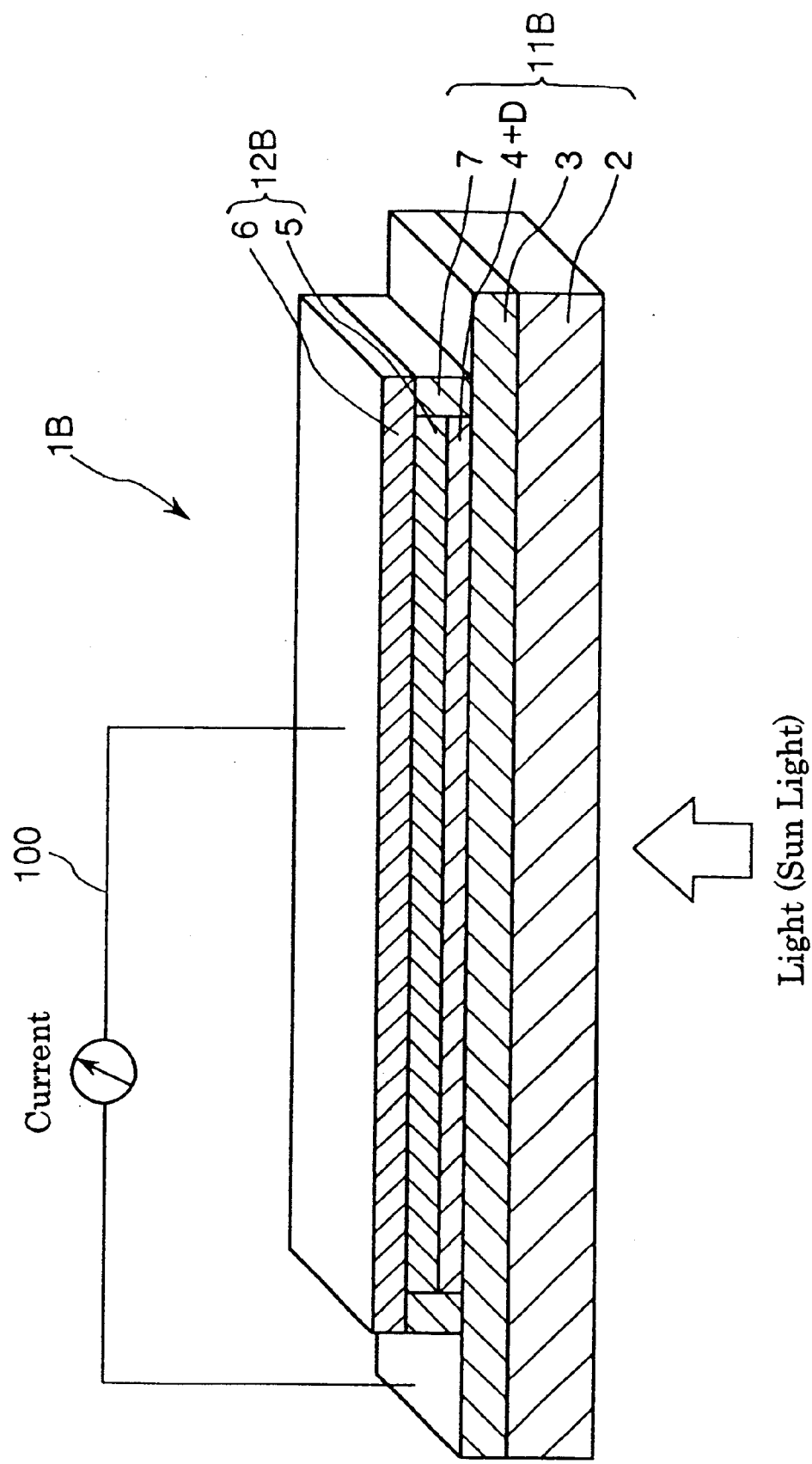

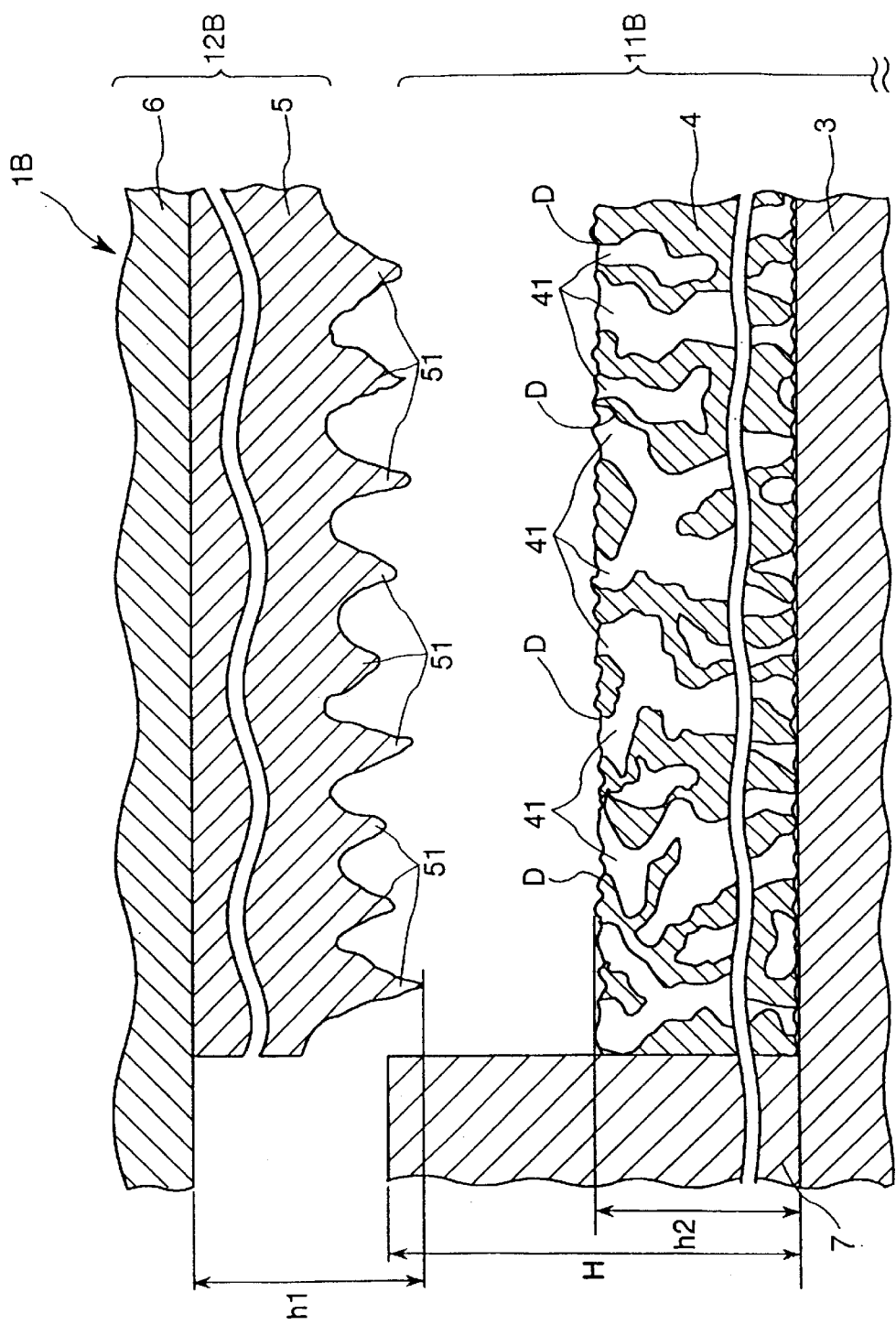

PHOTOELECTRIC CONVERSION ELEMENT

BACKGROND OF THE INVENTION

1. Field of the Invention

The present invention relates to a photoelectric conversion element.

2. Description of the Prior Art

From the approximately past ten years ago, great attention has been paid to solar cells (photoelectric conversion element) employing silicon as a power source which is harmless to the environment. As for these solar cells employing silicon, a monocrystalline silicon type solar cell is known, which is used in artificial satellites or the like. In addition, as solar cells for practical applications, there are known a solar cell employing polycrystalline silicon (single crystal silicon) and a solar cell employing amorphous silicon. These solar cells have already been practically used in industrial and household applications.

However, since these solar cells employing silicon require high manufacturing cost and a great deal of energy in manufacturing thereof, thus these solar cells are not yet established as an energy-saving power source.

Further, since a dye-sensitized wet solar cell such as those disclosed in Japanese laid-open patent applications No. H01-220380, No. H05-504023 and No. H06-511113 employs an electrolyte of which vapor pressure is extremely high, there is a problem in that the electrolyte volatilizes.

For solving the problem, a perfect solid type dye-sensitized solar cell has been proposed (K. Tennakone, G. R. R. A. Kumara, I. R. M. Kottegoda, K. G. U. Wijiayantha, and V. P. S. Perera: J. Phys. D: Appl. Phys. 31(1998)1492). This solar cell is composed of an electrode on which a $TiO_2$ layer is laminated and a p-type semiconductor layer provided on the $TiO_2$ layer. However, this solar cell has a problem in that the p-type semiconductor layer is liable to penetrate the $TiO_2$ layer to short-circuit the electrode.

Further, in the above proposal, CuI is used as a constituent material of the p-type semiconductor. The solar cell employing the CuI has a problem in that a generated current is lowered due to its deterioration caused by the increase in the crystal grain size of CuI and the like.

SUMMARY OF THE INVENTION

It is an object of the present invention to provide a solid type dye-sensitized photoelectric conversion element which is excellent in photoelectric conversion efficiency and which can be manufactured at a low cost.

In order to achieve the above object, the present invention is directed to a photoelectric conversion element, which comprises a first electrode; a second electrode arranged opposite to the first electrode; an electron transport layer arranged between the first electrode and the second electrode, at least a part of the electron transport layer being formed into porous; a dye layer which is in contact with the electron transport layer; a hole transport layer arranged between the electron transport layer and the second electrode; and short-circuit preventing means for preventing or suppressing short-circuit between the first electrode and the hole transport layer.

This makes it possible to provide a solid type dye-sensitized photoelectric conversion element having an excellent photoelectric conversion efficiency.

In the present invention, it is preferred that the short-circuit preventing means includes a barrier layer having a porosity smaller than the porosity of the electron transport layer. This makes it possible to more reliably prevent or suppress short-circuiting caused by electrical contact or the like between the first electrode and the hole transport layer, thereby enabling to effectively prevent the photoelectric conversion efficiency of the photoelectrical conversion element from being lowered.

In this case, it is preferred that when the porosity of the barrier layer is defined by A% and the porosity of the electron transport layer is defined by B%, the value of B/A is equal to or greater than 1.1. This makes it possible for the barrier layer and the electron transport layer to exhibit respective functions more appropriately.

More preferably, the porosity of the barrier layer is set to be equal to or less than 20%. This makes it possible to prevent or suppress the short-circuiting between the first electrode and the hole transport layer more reliably.

Further, it is preferred that the ratio of the thickness of the barrier layer with respect to the thickness of the electron transport layer is in the range of 1:99 to 60:40. This also makes it possible to prevent or suppress the short-circuiting between the first electrode and the hole transport layer more reliably. Further, it is also possible to effectively prevent the amount of light to be reached to the dye layer from being reduced.

Furthermore, it is also preferred that the average thickness of the barrier layer is in the range of 0.01 to 10 $\mu$m. This also makes it possible to effectively prevent the amount of light to be reached to the dye layer from being reduced.

Moreover, it is also preferred that the barrier layer has electric conductivity which is substantially the same as that of the electron transport layer. This makes it possible to effectively move electrons from the electron transport layer to the barrier layer.

Moreover, it is also preferred that the barrier layer is mainly constituted from titanium oxide. This also makes it possible to effectively move electrons from the electron transport layer to the barrier layer.

Moreover, it is also preferred that the barrier layer is formed by means of a MOD method including a metal organic deposition and a metal organic decomposition. This makes it possible to easily and reliably obtain a barrier layer having a dense structure, that is having a desired porosity.

In this case, preferably the barrier layer is formed using a barrier layer material when the barrier layer is formed by means of the MOD method, in which the barrier layer material contains a metal alkoxide and an additive having a function for stabilizing the metal alkoxide.

Further, preferably, the additive is a hydrolysis suppressing agent that suppresses hydrolysis of the metal alkoxide by being replaced with alkoxyl group of the metal alkoxide and coordinated with the metallic atoms of the metal alkoxide.

Further, it is also preferred that the resistance value in the thickness direction of the total of the barrier layer and the electron transport layer is equal to or greater than 100 $k\Omega/cm^2$. This makes it possible to prevent or suppress the short-circuiting between the first electrode and the hole transport layer more reliably.

Furthermore, it is also preferred that the barrier layer is disposed between the barrier layer and the electron transport layer. This also makes it possible to prevent or suppress the short-circuiting between the first electrode and the hole transport layer even more reliably.

In this case, it is preferred that the boundary between the barrier layer and the electron transport layer is unclear. This makes it possible to reliably move electrons between the electron transport layer and the barrier layer.

It is also preferred that the barrier layer and the electron transport layer are integrally formed with each other. This also makes it possible to reliably move electrons between the electron transport layer and the barrier layer.

Further, it is also preferred that a part of the electron transport layer functions as the barrier layer. This also makes it possible to reliably move electrons between the electron transport layer and the barrier layer.

In the present invention, it is preferred that the short-circuit preventing means is a spacer which defines a space between the fist electrode and the hole transport layer. This makes it possible to more reliably prevent or suppress short-circuiting caused by electrical contact or the like between the first electrode and the hole transport layer, thereby enabling to effectively prevent the photoelectric conversion efficiency of the photoelectrical conversion element from being lowered.

In this case, it is preferred that when the average thickness of the spacer is defined by H $\mu$m, the maximum thickness of the hole transport layer is defined by h1 $\mu$m, and the total thickness of the electron transfer layer and the dye layer is defined by h2 $\mu$m, they are configured so as to satisfy the relationship represented by the formula of h1+h2>H$\geq$h1. This makes it possible to even more reliably prevent or suppress short-circuiting caused by electrical contact or the like between the first electrode and the hole transport layer.

In the present invention, it is also preferred that the dye layer functions as a light receiving layer which generates electrons and holes when receiving light. Such a dye layer is most preferable to the present invention.

In this case, it is preferred that the electron transport layer has an outer surface and a number of holes each having an inner surface, and the dye layer is formed on the outer surface of the electron transport layer as well as along the inner surfaces of the holes. This makes it possible to transport the electrons generated in the dye layer to the electron transport layer effectively.

Further, it is also preferred that the electron transport layer has at least a function that transports the electrons generated in the dye layer. Such an electron transport layer is most preferable to the present invention.

In the present invention, it is also preferred that the electron transport layer is formed into a film-like shape. This makes it possible to form the element into a thinner structure and to reduce its manufacturing cost.

Preferably, the average thickness of the electron transport layer is in the range of 0.1 to 300 $\mu$m. This makes it possible to form the element into a thinner structure with maintaining the photoelectric conversion efficiency of the photoelectric conversion element appropriately.

In the present invention, it is also preferred that the porosity of the electron transport layer is in the range of 5 to 90%. This makes it possible to sufficiently enlarge the formation area of the dye layer. As a result, the dye layer enables to generate sufficient amount of electrons, and transport them to the electron transport layer with high efficiency.

In the present invention, it is also preferred that at least a part of the electron transport layer is formed of an electron transport layer material in the form of powder having the average particle size of 1 nm to 1 $\mu$m. This makes it possible to obtain a porous electron transport layer more easily and reliably.

Further, it is also preferred that at least a part of the electron transport layer is formed of an electron transport layer material by means of a sol-gel method employing a sol liquid containing powder having the average particle size of 1 nm to 1 $\mu$m. This also makes it possible to obtain a porous electron transport layer more easily and reliably.

In this case, it is preferred that the content of the powder of the electron transport material in the sol liquid is in the range of 0.1 to 10 wt %. This makes it possible to set the porosity of the electron transport layer appropriately.

In the present invention, it is also preferred that the electron transport layer is mainly formed of titanium dioxide. This enables the electron transport layer to enhance its electron transporting ability, and the electron transport layer itself becomes to generate electrons.

In the present invention, it is also preferred that the hole transport layer is mainly formed of a substance having ion conductive property. This makes it possible for the hole transport layer to transport holes generated in the dye layer effectively.

In this case, preferably, the substance having the ion conductive property is a metal halide compound. This also makes it possible for the hole transport layer to transport holes generated in the dye layer more effectively. More preferably, the metal halide compound includes a metal iodide compound. This also makes it possible for the hole transport layer to transport holes generated in the dye layer furthermore effectively.

Further, it is also preferred that the hole transport layer is formed by applying the hole transport material containing the substance having the ion conductive property onto the dye layer by means of a coating method. This enables to increase the contact area between the dye layer and the hole transport layer so that the hole transport layer can transport holes more effectively.

In this case, it is preferred that the hole transport layer is formed by applying the hole transport layer material onto the dye layer while the dye layer is being heated. This makes it possible to form the hole transport layer in a short time.

Further, it is also preferred that the hole transport layer material contains a crystal size coarse suppressing substance which suppresses increase in the crystal size of the substance having the ion conductive property when the substance crystallizes.

In this case, it is preferred that the content of the crystal size coarse suppressing substance in the hole transport layer material is in the range of $1 \times 10^{-6}$ to 10 wt %.

It is also preferred that the crystal size coarse suppressing substance includes thiocyanic acid salt, ammonium halide, or cyanoethylate.

Further, it is also preferred that the crystal size coarse suppressing substance suppresses the increase in the crystal size of the metal iodide compound when the metal iodide compound crystallizes by being bonded to the metallic atoms of the metal iodide compound.

Furthermore, it is also preferred that the hole transport layer material contains a hole transport efficiency enhancing substance that enhances the transport efficiency of the holes. This makes it possible for the hole transport layer to have enhanced hole transfer efficiency and improved electrical conductivity.

In this case, it is preferred that the content of the hole transport efficiency enhancing substance in the hole transport layer material is in the range of $1 \times 10^{-4}$ to $1 \times 10^{-1}$ wt %. This makes it possible to further enhance the hole transfer efficiency.

Further, it is also preferred that the hole transport efficiency enhancing substance includes a halide. More preferably, the halide is ammonium halide. This also makes it possible to further enhance the hole transfer efficiency.

In the present invention, it is preferred that the photoelectric conversion element further comprises a substrate for supporting the first electrode.

Further, in the present invention, it is also preferred that when the first electrode and the second electrode are applied with a positive and a negative voltage, respectively, with their difference being 0.5V, its resistance is larger than about 100 $\Omega/cm^2$. The fact that the photoelectric conversion element has such a characteristic as mentioned above means that occurrence of short-circuiting between the first electrode and the hole transport layer is effectively prevented or suppressed. Therefore, such a photoelectric conversion element can have more improved photoelectric conversion efficiency.

Furthermore, in the present invention, it is also preferred that when the photoelectric conversion efficiency for the angle of incidence of light on the dye layer of 90° and 52° (which are respectively an angle defined between the direction of the light and the surface of the semiconductor) are designated by $R_{90}$ and $R_{52}$, respectively, the ratio $R_{52}/R_{90}$ is larger than 0.8. The fact that the photoelectric conversion element can have such a characteristic as mentioned above means that the photoelectric conversion element has a low directivity for light, that is, it is isotropic to light. Accordingly, such a photoelectric conversion element can generate power more efficiently over almost entire range of shining period of the sun, if such a photoelectric conversion element is used outdoor.

Moreover, the photoelectric conversion element of the present invention is preferably applied to a solar cell. Although the photoelectric conversion element of the present invention may be applied to various devices or apparatuses, it is particularly preferably applied to a solar cell.

These and other objects, structures and advantages of the present invention will be apparent from the following detailed description of the invention and the examples taken in conjunction with the appended drawings.

BRIEF DESCRIPTION OF THE DRAWINGS

FIG. 8 is a cross sectional view which shows a structure of the solar cell of a second embodiment according to the present invention.

FIG. 9 is an illustration for explaining other manufacturing method of the solar cell of the second embodiment (that is, an enlarged cross sectional view which shows a state before the electron transport layer formed with the dye layer and the hole transport layer are joined).

DETAILED DESCRIPTION OF THE PREFERRED EMBODIMENTS

In the following, the photoelectric conversion element will be described in detail with reference to preferred embodiments shown in the accompanying drawings.

<First Embodiment>

Figure 1:
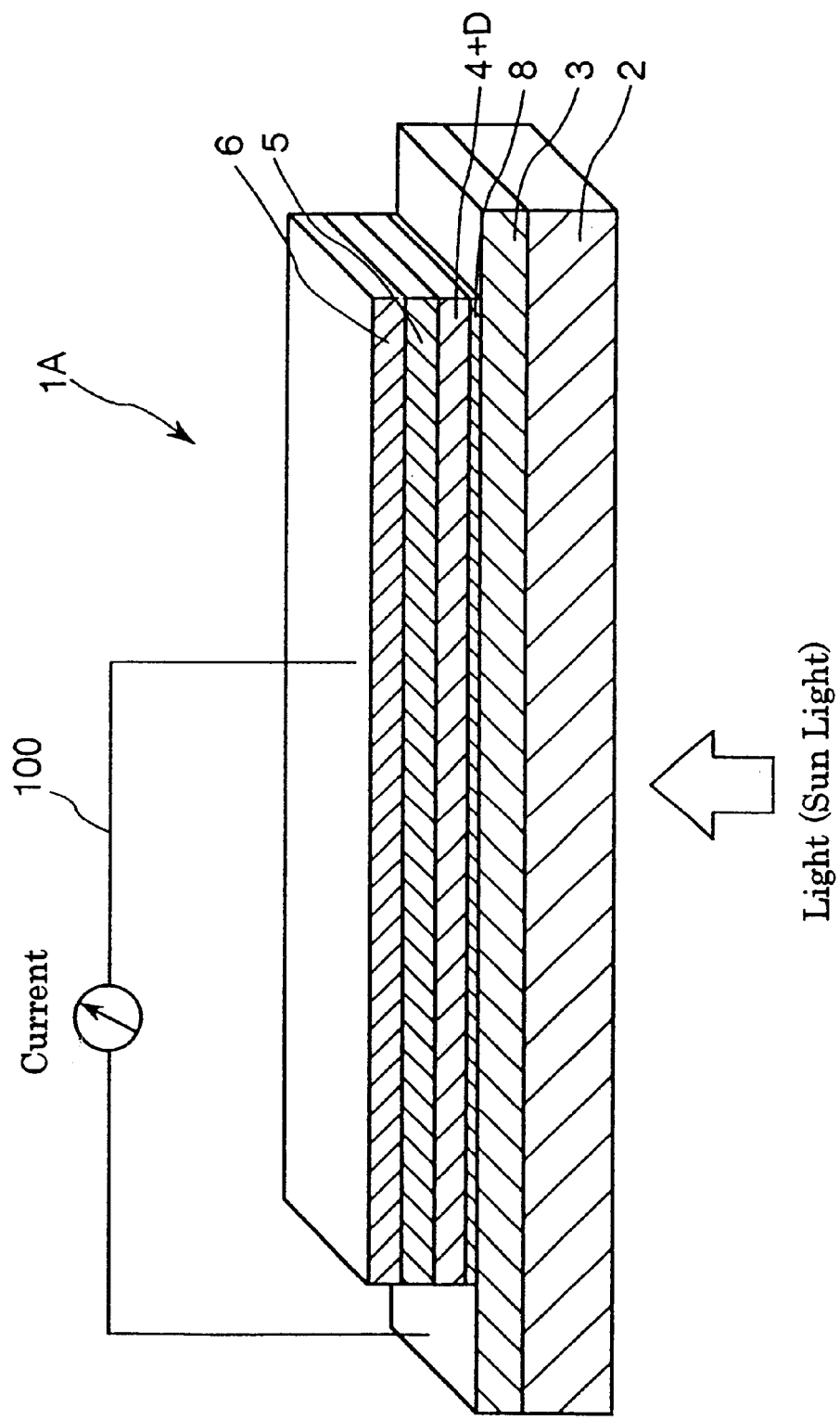
FIG. 1 is a cross sectional view of a part of a first embodiment of the present invention which is a case that the photoelectric conversion element of the present invention is applied to a solar cell.
Figure 2:
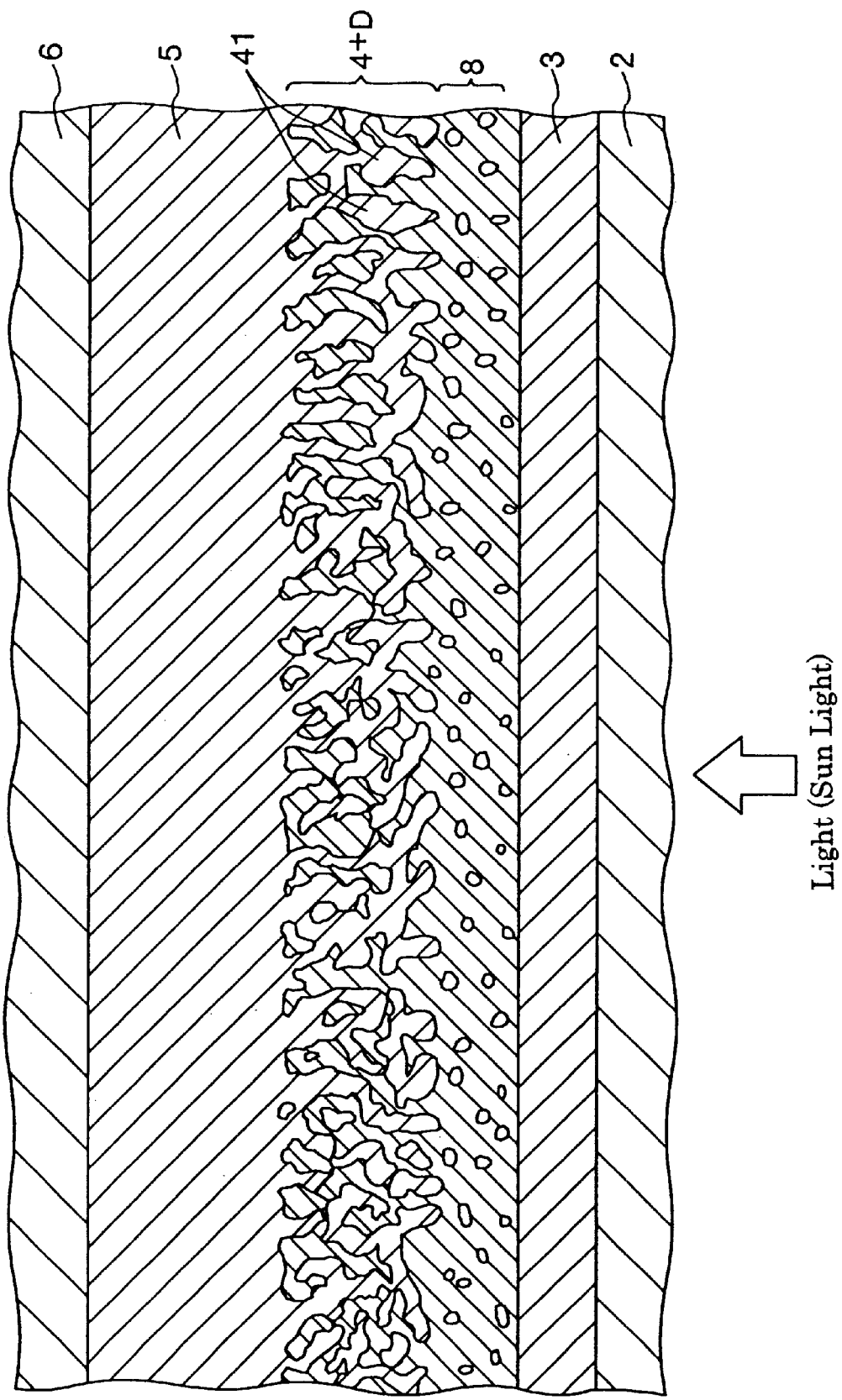
FIG. 2 is an enlarged cross-sectional view which shows a cross section in the vicinity of the central part of the solar cell of the first embodiment along with its thickness direction.
Figure 3:
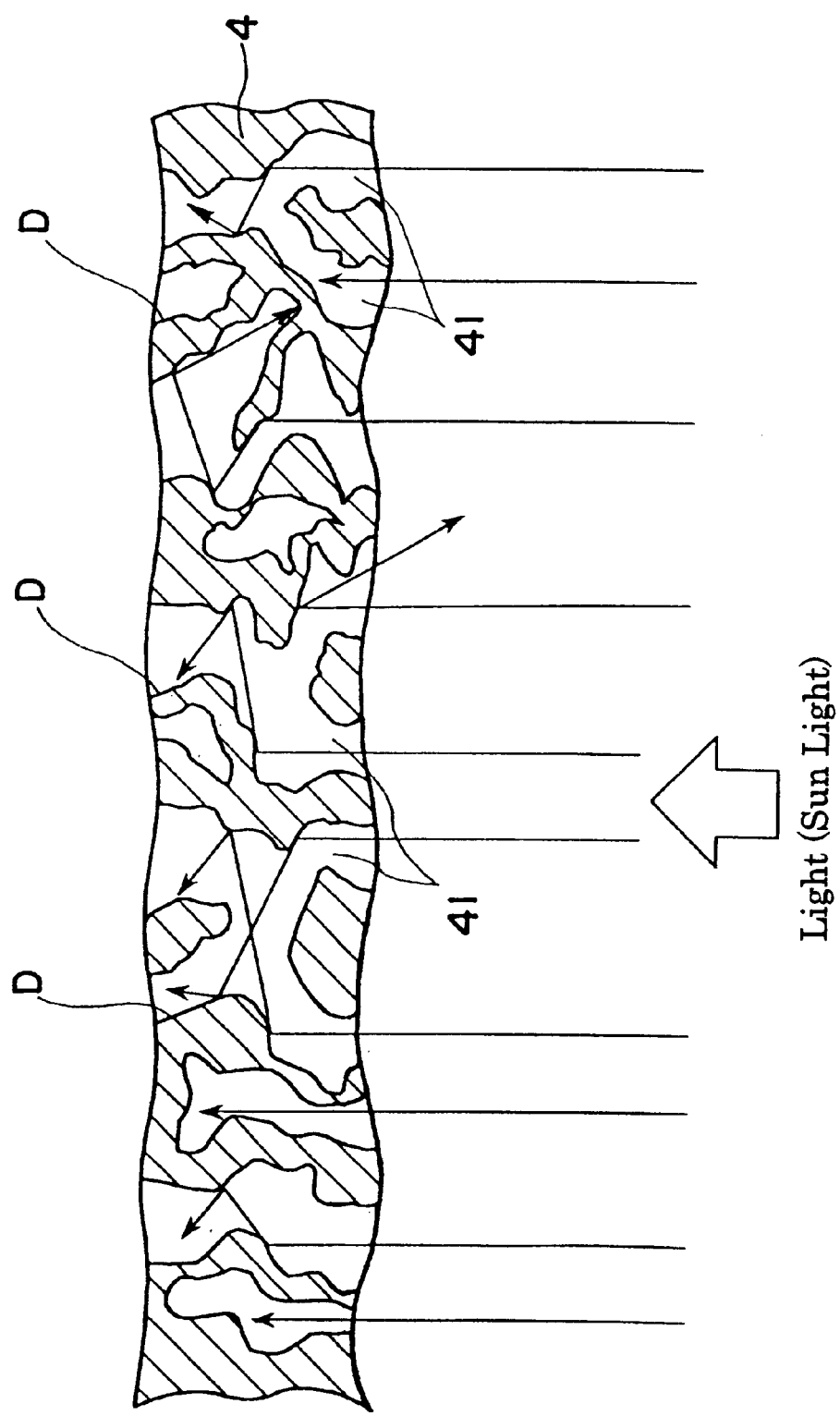
FIG. 3 is an enlarged cross-sectional view which shows the cross section of the electron transport layer in which a dye layer is formed.
Figure 4:
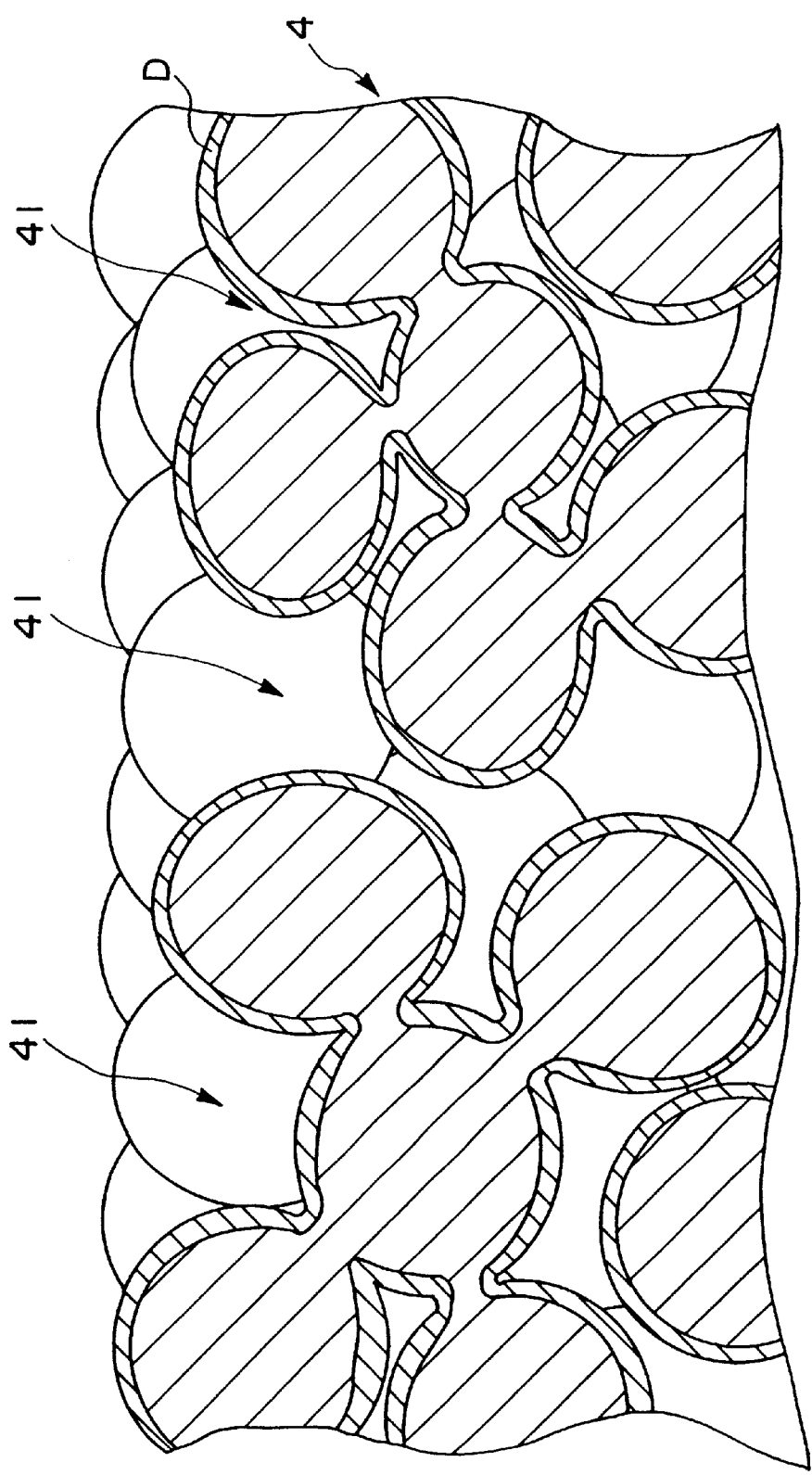
FIG. 4 is a schematic view which shows the structure of the electron transport layer and the dye layer.
Figure 5:
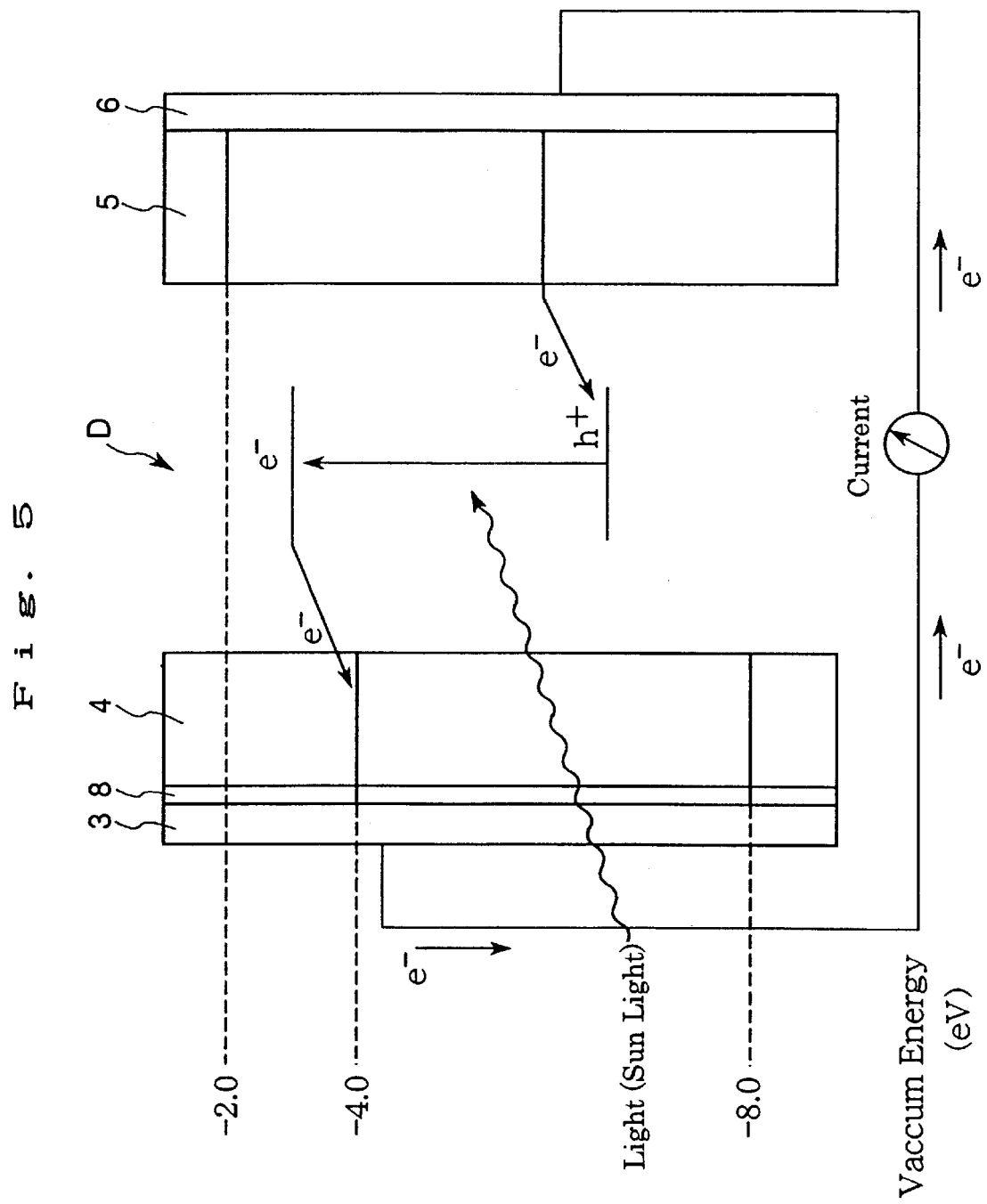
FIG. 5 is a schematic illustration which shows the principle of the solar cell.
Figure 6:
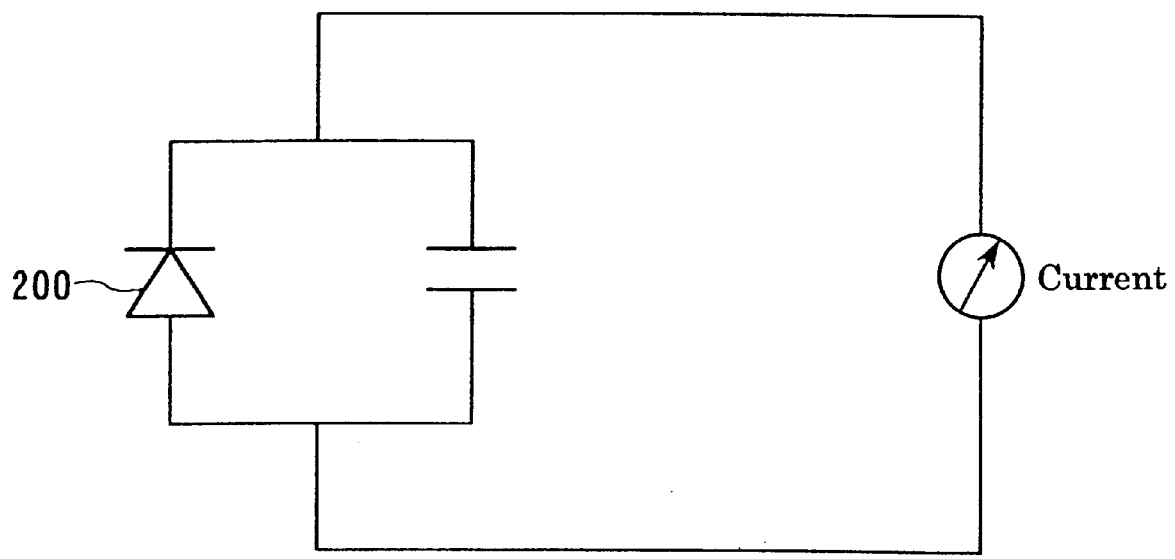
FIG. 6 is a diagram which shows an equivalent circuit of the circuit used in the solar cell shown in FIG. 1.

FIG. 1 is a partial cross sectional view which shows a first embodiment which is a case that the photoelectric conversion element of the present invention is applied to a solar cell, FIG. 2 is an enlarged cross sectional view which shows the cross-section of the first embodiment of the solar cell in the vicinity of the central part in its thickness direction, FIG. 3 is a partially enlarged view which shows the cross-section of an electron transport layer formed with a dye layer, FIG. 4 is a schematic diagram which shows the constitution of the electron transport layer and the dye layer, FIG. 5 is a schematic diagram which shows the principle of the solar cell, and FIG. 6 is a diagram showing an equivalent circuit of the solar cell circuit shown in FIG. 1.

A solar cell 1A shown in FIG. 1 is a type that does not require an electrolytic solution, and it is referred as a so-called dry solar cell. The solar cell 1A has a first electrode 3, a second electrode 6 arranged facing the first electrode 3, an electron transport layer 4 arranged between these electrodes, a dye layer D which is in contact with the electron transfer layer 4, a hole transport layer which is arranged between the electron transport layer 4 and the second electrode 6 and is in contact with the dye layer D, and a barrier layer 8, and these elements are provided on a substrate 2.

In the following, each constitutive element will be described, in which the upper side and the lower side of each layer (member) in FIG. 1 and FIG. 2 will be referred to as a top face and a bottom face, respectively.

The substrate 2 is provided for supporting the first electrode 3, the barrier layer 8, the electron transport layer 4, the dye layer D, the hole transport layer 5 and the second electrode 6, and it is formed from a plate-like member.

As shown in FIG. 1, the solar cell 1A of this embodiment is used by receiving light, for example, sunlight (hereinafter, referred to simply as "light") from the side of the substrate 2 and the first electrode 3, that is, by being illuminated with the light from the side of the substrate 2 and the first electrode 3. For this reason, it is preferable that the substrate 2 and the electrode 3 are respectively substantially transparent. By so choosing, light can be made to arrive at the dye layer D with high efficiency. What is meant here by the term of the substantially transparent is that it may be either one of achromatically transparent, chromatically transparent or semitransparent.

Examples of the constituent material of the substrate 2 include various kinds of glass material, various kinds of ceramic material, various kinds of resin material such as polycarbonate (PC) and polyethylene terephthalate (PET), or various kinds of metallic material such as aluminum.

The average thickness of the substrate 2 is appropriately set depending upon the material, usage or the like, and is not particularly limited, but it may be set, for example, as follows.

When the substrate 2 is formed of, for example, a hard material such as a glass material, it is preferable that its average thickness is about 0.1 to 1.5 mm, and more preferably about 0.8 to 1.2 mm.

Moreover, when the substrate 2 is formed of a flexible raw material such as polyethylene terephthalate (PET), for example, it is preferable that its average thickness is about 0.5 to 150 $\mu$m, and more preferably about 10 to 75 $\mu$m.

In this connection, it should be noted that the substrate 2 may be omitted as needed.

On the top face of the substrate 2, there is provided a layer-form (plate-like) first electrode 3. In other words, the electrode 3 is installed on the side of the light-receiving face of the electron transport layer 4 on which the dye layer D that will be described later is formed so as to cover the light-receiving face. The electrode 3 receives electrons generated in the dye layer D via the electron transport layer 4 and the barrier layer 8, and transmits them to an external circuit 100 connected thereto.

The constituent material for the first electrode 3 is not particularly limited. Examples of the constituent material include metal oxides such as indium-tin oxide (ITO), fluorine-doped tin oxide (FTO), indium oxide (IO) and tin oxide ($SnO_2$), metals such as aluminum, nickel, cobalt, platinum, silver, gold, copper, molybdenum, titanium, and tantalum or their alloys, or various kinds of carbon materials such as graphite may be mentioned, and one kind or a combination of two or more kinds of these materials may be used.

The average thickness of the first electrode 3 is appropriately set depending upon the material, usage and the like, and is not particularly limited, but it may be set, for example, as in the following.

When the first electrode 3 is formed of a metallic oxide, namely, of a transparent conductive metallic oxide, it is preferable that its average thickness is about 0.05 to 5 $\mu$m, and more preferably about 0.1 to 1.5 $\mu$m.

Moreover, when the first electrode 3 is formed of a metal in the above or its alloy or one of the various kinds of carbon materials, it is preferable that its average thickness is about 0.01 to 1 $\mu$m, and more preferably about 0.03 to 0.1 $\mu$m.

The first electrode 3 is not limited to the structure shown in the figure, and it may be formed into a shape, for example, which has a plurality of comb teeth. In this case, since light arrives at the dye layer D by passing the spaces between the plurality of comb teeth, the first electrode 3 need not be transparent. This choice of the shape extends the latitude of selection of the constituent material for the first electrode 3 and its manufacturing method. Moreover, in this case, the average thickness of the electrode 3 is not particularly limited, but it is preferable that it is about 1 to 5 m.

Furthermore, it is possible to use a combination of comb-teeth-like electrode and a transparent electrode made of ITO, FTO or the like as the first electrode 3. When combining these electrodes, they may be laminated with each other, for example.

On the top face of the first electrode 3, a film-like barrier layer 8 is provided. The barrier layer 8 acts as preventing means against short-circuiting, and the details of the barrier layer 8 will be described later.

On the top face of the barrier layer 8, there are provided a porous electron transport layer 4 and the dye layer D which is in contact with the electron transport layer 4.

The electron transport layer 4 has at least a function of transporting electrons generated in the dye layer D.

Examples of the constituent material of the electron transport layer 4 include n-type oxide semiconductor materials such as titanium oxides (e.g. titanium dioxide ($TiO_2$), titanium monoxide (TiO), titanium trioxide ($Tl_2O_3$), and the like); zinc oxide (ZnO); tin oxide ($SnO_2$), and other n-type semiconductor materials. One kind or a combination of two or more kinds of these materials may be used. Among these materials, titanium oxides, in particular titanium dioxide are especially preferred as the constituent material for the electron transfer layer 4. That is, it is preferable that the electron transport layer 4 is composed of titanium dioxide.

Titanium dioxide is superior in particular in the transport performance of electrons. Moreover, since titanium dioxide has a high sensitivity to light, the electron transport layer 4 is capable of generating electrons by itself. As a result, the solar cell 1A can further enhance the photoelectric conversion efficiency (power generation efficiency).

Further, since the crystal structure of titanium dioxide is stable, the electron transport layer 4 having titanium dioxide as the principal material has an advantage that it has a small secular change (deterioration) and therefore is capable of continuously providing a stable performance for a long period of time even when it is exposed to a severe environment.

Moreover, as for the titanium dioxide, its crystal structure may be either one of the anatase-type, the rutile-type, or a mixture of the anatase-type and the rutile-type.

The electron transport layer 4 having titanium dioxide with anatase-type crystal structure has an advantage that it can transport electrons with higher efficiency.

When mixing the rutile-type titanium dioxide and the anatse-type titanium dioxide, their mixing ratio is not particularly limited, but it is preferable that it is about 95:5 to 5:95 in weight, and more preferably about 80:20 to 20:80.

The electron transport layer 4 has a number of holes (pores) 41. As shown in FIG. 3 which illustrates schematically the state of incidence of light on the electron transport layer 4, light passed through the barrier layer 8 (an arrow in FIG. 3) penetrates to the interior of the electron transport layer 4, and passes through the electron transport layer 4 or is reflected (irregularly, diffused or the like) within the holes 41. In this case, light makes contact with the dye layer D, and it can generate electrons and holes in the dye layer D with a high frequency.

The porosity of the electron transport layer 4 is not limited particularly, but it is preferable that it is about 5 to 90%, more preferably about 15 to 50%, and even more preferably about 20 to 40%.

By setting the porosity of the electron transport layer 4 in such a range, it is possible to sufficiently enlarge the surface area of the electron transport layer 4. Accordingly, as will be described later, the formation area of the dye layer D formed along the outer face of the electron transport layer 4 and the inner face of the holes 41 can also be enlarged sufficiently. Because of this, the dye layer D can generate sufficient quantity of electrons. Moreover, the dye layer D can transport these electrons to the electron transport layer 4 with high efficiency. As a result, the solar cell 1A can further enhance the power generation efficiency (photoelectric conversion efficiency).

The electron transport layer 4 may have a relatively large thickness, but it is preferable that it has a film-like shape. With this choice, it will be advantageous in thinning (miniaturization) and reduction in the manufacturing cost of the solar cell 1A.

In this case, the average thickness of the electron transport layer 4 is not limited particularly, but it is preferable that it is about 0.1 to 300 $\mu$m, and more preferably about 1 to 25 $\mu$m.

The electron transport layer 4 is formed so as to make contact with the dye layer D. For this purpose, the dye layer D is formed so that a dye is adsorbed or bonded (covalently bonded, coordination bonded or the like) to the electron transport layer 4.

The dye layer D is a light-receiving layer that generates the pairs of electron and hole by receiving light, and as shown in FIG. 4, it is formed along the outer face of the electron transport layer 4 and the inner face of the holes 41. In this way, electrons generated in the dye layer D can be transported to the electron transport layer 4 with high efficiency.

The dye constituting the dye layer D is not particularly limited, but pigments, dyes or the like can be mentioned, and these may be used independently or in combination. Of these, from the viewpoint of small secular change and degradation, it is preferable to use pigments as the dye. On the other hand, from the view point of excellence in adsorption to (bonding with) the electron transport layer 4, it is preferable to use dyes as the coloring matter.

Further, the pigment to be used is not particularly limited to a specific one, and various pigments such as organic pigments and inorganic pigments can be used. Examples of the organic pigment include phthalocyanine pigments such as phthalocyanine green, phthalocyanine blue and the like; azo pigments such as arylide yellow, diarylide yellow, disazo condensation yellow, benzimidazolone yellow, dinitroaniline orange, benzimidazolone orange, toluidine red, permanent carmine, permanent red, naphthol red, disazo condensation red, benzimidazolone carmine, benzimidazolone brown and the like; anthraquinone pigments such as anthrapyrimidine yellow, anthraquinonyl red and the like; azomethine type pigments such as, azomethine yellow (copper) and the like; quinophthalone pigments such as quinophthalone yellow and the like; isoindoline pigments such as isoindoline yellow and the like; nitroso pigments such as dioxine yellow (nickel) and the like; perinone pigments such as perinone orange and the like; quinacridone pigments such as quinacridone magenta, quinacridone maroon, quinacridone scarlet, quinacridone red and the like; perylene pigments such as perylene red, perylene maroon, and the like; pyrropyrrolpigments such as diketo pyrropyrrol red and the like; and dioxazine pigments such as dioxazine violet and the like. Example of the inorganic pigment include carbon pigments such as carbon black, lamp black, furnace black, ivory black, graphite, fullerene, and the like; chromate pigments such as chrome yellow, molybdate orange, and the like; sulfide pigments such as cadmium yellow, cadmium lithopone yellow, cadmium orange, cadmium lithopone orange, vermilion, cadmium red, cadmium lithopone red, and the like; oxide pigments such as ochre, titanium yellow, titanium-barium-nickel yellow, red iron oxide, red lead, umber, brown iron oxide, zinc iron chromite brown spinel, chromium oxide, cobalt green, cobalt chromite green spinel, cobalt titanate green spinel, cobalt blue, cerulean blue, cobalt-alminum-chromium blue, black iron oxide, manganese ferrite black, cobalt ferrite black, copper chromite black spinel, copper chromite manganese black, and the like; hydroxide pigments such as viridian green and the like; ferrocyanide pigments such as Prussian blue and the like; silicate pigments such as ultramarine blue and the like; phosphate pigments such as cobalt violet and mineral violet; and other pigments (such as cadmium sulfide, cadmium selenide). In this case, one kind of these pigments or a mixture of two or more kinds of these pigments may be employed.

Furthermore, the dye is also not particularly limited to a specific one. Examples of the dye include metal complex dye such as $RuL_2(SCN)_2$, $RuL_2Cl_2$, $RuL_2(CN)_2$, Ruthenium535-bisTBA (manufactured and sold by Solaronics, Inc.), and $[RuL_2(NCS)_2]_2H_2O$, ruthenium tris (bipyridyl), and the like; cyan dye; xanthene dye; azo dye; hibiscus color; black berry color; raspberry color; pomegranate juice color; and chlorophyll. In this case, one kind of these dyes or a mixture of two or more kinds of these dyes may be employed. Note that, "L" in the chemical formula described above indicates 2,2'-bipyridine or the derivatives thereof.

On the top face of the electron transport layer 4 formed with the dye layer D, a layer-like hole transport layer 5 is provided. In other words, the hole transport layer 5 is provided facing the first electrode 3 via the electron transport layer 4 formed with the dye layer D. The hole transport layer 5 has a function of capturing and transporting the holes generated in the dye layer D. That is, the hole transport layer 5 has a function of transporting the holes to the external circuit 100 via the second electrode 6 or the hole transport layer 5 itself acting as an electrode.

The average thickness of the hole transport layer 5 is not particularly limited, but it is preferable that it is about 1 to 500 $\mu$m, more preferably about 10 to 300 $\mu$m, and even more preferably about 10 to 30 $\mu$m.

The constituent material of the hole transport layer 5 is not particularly limited, and various kinds of material can be used. Examples of such a material include materials having ion conductive property; various kinds of p-type semiconductor materials such as triphenyldiamines (monomers, polymers and the like), polyanilines, polypyrroles, polythiophenes, phthalocyanine compounds (e.g. copper phthalocyanine) and there derivatives; and metals such as aluminum, nickel, cobalt, platinum, silver, gold, copper, molybdenum, titanium and tantalum, or alloys containing any one or more of these metals. Further, one kind or a combination of two or more kinds of these materials may be used. Among these materials, the materials having ion conductive property are particularly preferred as the constituent material for the hole transport layer 5. In other words, it is preferable that the hole transport layer 5 is mainly composed of a material having ion conductive property. With this choice, the hole transport layer 5 can transport the holes generated in the dye layer D with high efficiency.

As for the materials having ion conductive property, no particular limitations exist, but metal halides such as CuI and AgI, and metal bromide such as AgBr, and metal thiocyanides such as CuSCN, for example, may be mentioned. In this case, one kind or a combination of two or more kinds of these materials may be used. Among these materials, one kind or a combination of two or more kinds of metal iodides such as CuI and AgI are particularly preferred for the materials having ion conductive property. These metal iodides are particularly excellent in ion conductive property. Therefore, the use of a metal iodide can enhance the photoelectric conversion efficiency (energy conversion efficiency) of the solar cell 1A.

The hole transport layer 5 is formed such that it enters the holes 41 of the electron transport layer 4 which is formed with the dye layer D. Since the contact area of the dye layer D and the hole transport layer 5 can be increased in this way, the holes generated in the dye layer D can be transported into the hole transport layer 5 with higher efficiency. As a result, the solar cell 1A can further enhance the power generation efficiency.

The layer-form second electrode 6 is provided on the top face of the hole transport layer 5. The average thickness of the second electrode 6 is appropriately set depending upon its material, use or the like, and is not limited particularly.

The constituent material of the second electrode 6 is not particularly limited, but metals such as aluminum, nickel, cobalt, platinum, silver, gold, copper, molybdenum, titanium and tantalum, or alloys including any one or more of these metals, or various kinds of carbon materials such as graphite may be mentioned. In this case, one kind or a combination of two or more of these metals may be used.

In this connection, it is to be noted that the second electrode 6 may be omitted depending upon the requirement.

When light is incident on the solar cell 1A having such the structure described above, electrons are excited to generate pairs of an electron (e−) and a hole (h+) mainly in the dye layer D as shown in FIG. 5. Of these, the electrons move to the electron transport layer 4 and the holes move to the hole transport layer 5, respectively. With this result, a potential difference (photpvoltaic force) is generated across the first electrode 3 and the second electrode 6, and a current (photoexcited current) flows in the external circuit 100.

The values of the vacuum energy shown in FIG. 5 show an example of the case where the electron transport layer 4 and the barrier layer 8 are formed of titanium dioxide, and the hole transport layer 5 is formed of CuI.

This situation can be represented by an equivalent circuit shown in FIG. 6, in which a current circulation circuit having a diode 200 is formed.

Although a pair of electron and hole is generated simultaneously in the dye layer D as a result of illumination with light (light reception), in the following description an expression "an electron is generated" will be used for explaining this situation for the purpose of convenience.

Now, the feature of the present invention resides in the provision of a short-circuit (or leak) preventing means that prevents or suppresses short-circuit between the first electrode 3 and the hole transport layer 5.

In the following, the short-circuit preventing means will be described in detail.

In the present embodiment, a film-like barrier layer 8 is provided between the first electrode 3 and the electron transport layer 4 as the short-circuit preventing means. The barrier layer 8 is formed so as to have a porosity smaller than that of the electron transport layer 4.

In manufacturing the solar cell 1A, the material for the hole transport layer is coated by a coating method, for example, on the top face of the electron transport layer 4 which is formed with dye layer D, as will be described later.

In this case, in a solar cell which is not provided with the barrier layer 8, there is a case that the material for the hole transport layer penetrates into the holes 41 of the electron transport layer 4 with formed dye layer D and may reach the first electrode 3 if the porosity of the electron transport layer 4 is made large. In other words, in a solar cell that is not provided with the barrier layer 8, there may occur a short-circuiting by electrical contact between the electrode 3 and the hole transport layer 5. Therefore, a solar cell that is not provided with the barrier layer 8 has a larger leakage current, thus leasing to the case that the power generation efficiency, namely, photoelectric conversion efficiency will be reduced.

In contrast, in the solar cell 1A of this embodiment provided with the barrier layer 8, it is possible to prevent disadvantages as described in the above, so that the reduction in the power generation efficiency can be satisfactorily prevented or suppressed.

When the porosity of the barrier layer 8 is called A [%] and the porosity of the electron transport layer 4 is called B [%], it is preferable that the ratio B/A is larger than about 1.1, more preferably larger than about 5, and even more preferably larger than about 10. By such a choice, the barrier layer 8 and the electron transport layer 4 can exhibit their respective functions more satisfactorily.

Specifically, it is preferable that the porosity of the barrier layer 8 is somewhat smaller than 20%, more preferably somewhat smaller than 5%, and even more preferably somewhat smaller than 2%. In other words, it is preferable that the barrier layer 8 is formed into a dense layer. By so choosing, the effect in the above can further be enhanced.

Moreover, the ratio of the thickness of the barrier layer 8 and the electron transport layer 4 is not limited particularly, but it is preferable that it is about 1:99 to 60:40, and more preferably 10:90 to 40:60. In other words, it is preferable that the ratio of the thickness of the barrier layer 8 with respect to the total thickness of the barrier layer 8 and the electron transport layer 4 is about 1 to 60%, and more preferably about 10 to 40%. With this choice, the barrier layer 8 can more surely prevent or suppress the short-circuiting due to contact or the like between the electrode 3 and the hole transport layer 5. Moreover, such a barrier layer 8 can favorably prevent reduction in the reaching rate of light to the dye layer D.

More specifically, it is preferable that the average thickness (film thickness) of the barrier layer 8 is about 0.01 to 10 $\mu$m, more preferably about 0.1 to 5 $\mu$m, and even more preferably about 0.5 to 2 $\mu$m. With this choice, it is possible to furthermore enhance the effect described in the above.

The constituent material of the barrier layer 8 is not limited particularly, but in addition to titanium oxide which is the principal material for the electron transport layer 4, various kinds of metallic oxide, such as $SrTiO_3$, $ZnO$, $SiO_2$, $Al_2O_3$ and $SnO_2$, and various kinds of metallic compounds such as CdS, CdSe, TiC, $Si_3N_4$, SiC, $B_4N$ and BN, for example, may be used. In this case, one kind or a combination of two or more kinds of these materials may be used. Among these materials, a material having electrical conductivity equivalent to that of the electron transport layer 4 is particularly preferred for the constituent material for the barrier layer 8, and a material having titanium oxide as its principal constituent is more preferred. By constituting the barrier layer 8 with such a material, it is possible to transmit electrons generated in the dye layer D to the barrier layer 8 with high efficiency. As a result, the power generation efficiency of the solar cell 1A can further be enhanced.

Although the resistance in the thickness direction of the barrier layer 8 and the electron transport layer 4 are not limited particularly, it is preferable that the resistance in the thickness direction of the barrier layer 8 and the electron transport layer 4, that is the resistance in the thickness direction of a laminate of the barrier layer 8 and the electron transport layer 4 is larger than about 100 $\Omega/cm^2$, and more preferably larger than about 1 $k\Omega/cm^2$. With this choice, short-circuiting between the electrode 3 and the hole transport layer 5 can be prevented or suppressed more reliably. As a result, the reduction in the power generation efficiency of the solar cell 1A can be prevented.

Moreover, although the boundary between the barrier layer 8 and the electron transport layer 4 may be either unclear or clear, it is preferable that it is unclear. Namely, it is preferable that the barrier layer 8 and the electron transport layer 4 are formed integrally with being overlapped partially. As a result, the transmission of electrons between the layers can be performed more reliably, that is with high efficiency.

Furthermore, the barrier layer 8 and the electron transport layer 4 may be formed of the identical material (for example, using titanium dioxide as their principal material) with only their porosities different. In other words, it may be given a constitution in which a part of the electron transport layer 4 functions as the barrier layer 8.

In this case, the electron transport layer 4 has a dense portion and a coarse portion in the thickness direction thereof, and the dense portion functions as the barrier layer 8.

Moreover, in this case, although it is preferable that the dense portion is formed on the side of the electrode 3 of the electron transport layer 4, it may be formed at an arbitrary position in the thickness direction thereof.

Furthermore, in this case, the electron transport layer 4 may have a structure in which the coarse portion is surrounded by the dense portions or vice versa.

In such a solar cell 1A, when the photoelectric conversion efficiency for the angle of incidence of light on the dye layer D (the electron transport layer 4 formed with the dye layer D) of 90° and 52° (which are respectively an angle defined between the direction of the light and the surface of the semiconductor) are designated by $R_{90}$ and $R_{52}$, respectively, it is preferable that the ratio $R_{52}/R_{90}$ is larger than about 0.8, and more preferably larger than about 0.85. The case that such a condition is satisfied means that the electron transport layer 4 formed with the dye layer D has a low directivity for light, that is, it is isotropic to light. Accordingly, such a solar cell 1A can generate power more efficiently over almost entire range of shining period of the sun.

Moreover, in the solar cell 1A, when the first electrode 3 and the second electrode 6 are applied with a positive and a negative voltage, respectively, with their difference being 0.5V, it is preferable that the solar cell 1A has a property that its resistance is larger than about 100 $\Omega/cm^2$, and more preferably larger than about 1 $k\Omega/cm^2$. That fact that it has such a property means that short-circuiting due to electrical contact or the like between the electrode 3 and the hole transport layer 5 is properly prevented or suppressed in the solar cell 1A. Accordingly, such a solar cell 1A can further enhance the power generation efficiency.

Such a solar cell 1A can be manufactured in the following manner. First, a substrate 2 made of soda glass or the like is prepared. For the substrate 2, a glass board with uniform thickness and no warp is used preferentially.

<1> First, the first electrode 3 is formed on the top face of the substrate 2. In this case, the first electrode 3 can be formed by employing, for example, evaporation method, sputtering method, printing method or the like that uses the material for the electrode 3 such as FTO.

<2> Next, the barrier layer 8 is formed on the top face of the first electrode 3. The barrier layer 8 can be formed, for example, by the sol-gel method, evaporation (vacuum evaporation) method, sputtering method such as high frequency sputtering method or DC sputtering method, spray thermal decomposition method, jet molding (plasma spraying) method, CVD method or the like. Among these methods, it is preferable to form the barrier layer 8 by the sol-gel method.

The operation of the sol-gel method is extremely simple, and it may be used in combination with various kinds of coating method such as dipping, dripping, doctor blading, spin-coating, brushing, spraying, and roll coating. With this choice, it is possible to form a film-like (thick or thin film) barrier layer 8 properly without involving a large scale apparatus.

Moreover, when the coating method is used, it is possible to easily form a barrier layer 8 of a desired shape by performing masking using a mask or the like.

Examples of the sol-gel method include a method which prevents or does not permit the occurrence of reactions such as hydrolysis and condensation-polymerization in an organic or inorganic titanium compounds as will be described later, and a method which permits the occurrence of these reactions. In the following, the former type will be referred to as metal organic deposition method or metal organic decomposition method (MOD) method. Among these methods, the MOD method is particularly preferred for the sol-gel method.

According to the MOD method, the stability of the organic or inorganic titanium compounds in the barrier layer 8 can be secured. Moreover, according to the MOD method, it is possible to make the barrier layer 8 dense more easily and reliably, that is, to regulate the porosity within the prescribed range more easily with high reproducibility.

When forming such a dense $TiO_2$ barrier layer 8 of this embodiment by using an organic titanium compound, in particular using a chemically extremely unstable (decomposable) titanium alkoxide (metal alkoxide) such as titanium tetraisopropoxide (TPT), titanium tetramethoxide, titanium tetraethoxide or titanium tetrabutoxide, the MOD method is optimally suited.

In the following, the formation method of the barrier layer 8 by the MOD method will be described.

<Preparation of the Barrier Layer Material>

When, for example, using one kind or a combination of two or more kinds of organic titanium compounds of titanium alkoxides (metal aloxides) such as titanium tetraisopropoxide (TPT), titanium tetramethoxide, titanium tetraethoxide and titanium tetra butoxide, the organic titanium compound is first dissolved in an organic solvent such as ethanol anhydride, 2-butanol, 2-propanol, 2-n-butoxyethanol or a mixed solvent of these to obtain a solution.

In this way, the viscosity of the obtained material for the barrier layer is regulated by adjusting the concentration of the organic titanium compound in the solution which is set, for example, at about 0.1 to 10 mol/L. The viscosity of the barrier layer material is appropriately determined depending upon the kind of the coating method or the like. In this case, the viscosity is not limited to a specific value, but when the spin coating is adopted as the method of coating, it is preferable that the viscosity of the barrier layer material is set at a relatively high level of about 0.5 to 20 cP (at normal temperature). When the spray coating is adopted as the method of coating, it is preferable that the viscosity is set at a relatively low level of about 0.1 to 2 cP (at normal temperature).

Then, an additive that has a function for stabilizing the titanium alkoxide (metal alkoxide) such as titanium tetrachloride, acetic acid, acetylacetone, triethanolamine and diethanolamine is added to the solution.

By adding such an additive, the additive is replaced with the alkoxide (alkoxyl group) that is coordinated with the titanium atoms in the titanium alkoxide, so that it is coordinated with the titanium atoms. This suppresses hydrolysis of the titanium alkoxide to stabilize it. Namely, these additives function as a hydrolysis suppressing agent that suppresses hydrolysis of the titanium alkoxide. Although the compounding ratio of the additive and the titanium alkoxide is not limited particularly, it is preferable that it is about 1:2 to 8:1 in molar ratio.

Specifically, when diethanolamine is made to be coordinated with the titanium alkoxide, it replaces the alkoxyl group in the titanium alkoxide, and two molecules of diethanolamin are coordinated with a titanium atom. This compound replaced by diethanolamine is more stable in generating titanium dioxide than the titanium alkoxide. Other combinations are also acceptable.

In this way, a sol solution for forming the barrier layer which is the barrier layer material, namely, the sol solution for MOD is obtained.

When an inorganic titanium compound such as titanium tetrachloride (TTC) is used, it is dissolved in an organic solvent such as ethanol anhydride, 2-butanol, 2-propanol or 2-n-butoxyethanol, or a mixed solvent of these, to obtain a solution. In this manner, an organic solvent is coordinated with titanium atoms of the inorganic titanium compound, and forms a stable compound without addition of any additive.

Moreover, when an organic titanium compound such as titanium oxyacetonate (TOA) is used, a stable barrier layer material can be obtained by mere dissolving of the organic titanium compound in an organic solvent because the organic titanium conpound is stable on its own.

In this invention, when the barrier layer 8 is formed by the MOD method, it is most preferable to use a solution, among the three solutions described in the above, prepared by the following method. Namely, it is best suited to use a solution prepared by a method in which an organic titanium compound such as titanium alkoxide represented by titanium tetraisopropoxide (TPT), titanium tetramethoxide, titanium tetraethoxide or titanium tetrabutoxide, or a solution containing such compound is dissolved or diluted by a solvent above, and to add an additive to the solution obtained in this way such as titanium tetrachloride, acetic acid, acetylacetone, triethanolamine or diethanolamine. According to this method, it is possible to obtain a compound that can stably generate titanium dioxide by causing the additive to be coordinated with the titanium atoms of the titanium alkoxide.

In this way, the chemically unstable titanium alkoxide can be turned into a chemically stable compound. Such a compound is extremely useful in forming the barrier layer 8 of this embodiment, namely, a dense barrier layer 8 having titanium dioxide as the principal material.

<Formation of the Barrier Layer 8>

On the top face of the first electrode 3, the barrier layer material is formed in film-form by a coating method such as spin-coating. In employing the spin-coating method, it is preferable to set the number of revolutions at about 500 to 400 rpm.

Next, such a coating film is subjected to a heat treatment to remove the organic solvent by evaporation. It is preferable that the conditions of the heat treatment are at a temperature of about 50 to 250° C. for about 1 to 60 min, and more preferably at about 100 to 200° C. for about 5 to 30 min.

Such a heat treatment can be done in the air or in nitrogen gas, or may be done in a nonoxidizing atmosphere of various kinds of inert gas, vacuum, or a reduced pressure of about $10^{-1}$ to $10^{-6}$ Torr.

The coating of the barrier layer material to the top face of the first electrode 3 may be done while heating the electrode 3.

Furthermore, the coating film is subjected to a heat treatment at a temperature higher than that of the heat treatment in the above to remove the organic components left in the coating film. At this time, titanium dioxide is sintered to form a barrier layer 8 composed of titanium dioxide of amorphous or anatase-type crystal structure. The conditions of the heat treatment are preferably at about a temperature of 300 to 700° C. for about 1 to 70 min, and more preferable at about 400 to 550° C. and for 5 to 45 min.

The atmosphere of this heat treatment may be made the same as that of the heat treatment in the above.

Operations as described in the above are repeated preferably for about 1 to 20 times, and more preferably for about 1 to 10 times, to form a barrier layer 8 of average thickness as described in the above.

In this case, it is preferable that the thickness of the coating film obtainable in one time of operation is smaller than about 100 nm, and more preferably smaller than about 50 nm. By forming a barrier layer 8 by laminating such thin films, it is possible to obtain a barrier layer 8 with better uniformity and higher density. Incidentally, regulation of the film thickness obtainable in one time of operation can be achieved easily by adjusting the viscosity of the barrier layer material.

Prior to the formation of the barrier layer 8, organic substances attached to the top face of the first electrode 3 may be removed by an $O_2$ plasma treatment, EB treatment, or cleaning with an organic solvent such as ethanol or acetone. In this case, the top face of the first electrode 3 is masked by a mask layer, excluding the region for the formation of the barrier layer 8. The mask layer may be removed after formation of the barrier layer 8 or removed after completion of the solar cell 1A.

<3> Next, the electron transport layer 4 is formed on the top face of the barrier layer 8.

The electron transport layer 4 may be formed using, for example, the sol-gel method, evaporation method or sputtering method. Among these methods, the sol-gel method is particularly preferable for the electron transport layer 4.

The sol-gel method has an extremely simple operation, and may be used in combination with various kinds of coating method such as dipping, dripping, doctor blading, spin coating, brushing, spray coating and roll coating. In this way, the electron transport layer 4 can be formed satisfactorily in film-form (thick or thin film) without requiring a large scale apparatus.

Moreover, according to the coating method, an electron transport layer 4 with a desired pattern can be obtained easily by carrying out masking using a mask or the like.

For the formation of the electron transport layer 4, it is preferable to use a sol liquid containing powder of the electron transport layer material. With this arrangement, the electron transport layer 4 can be made porous easily and surely.

Although the average particle diameter of the powder of the electron transport layer material is not limited particularly, it is preferable that it is about 1 nm to 1 m, and more preferably 5 to 50 nm. By setting the average particle diameter of the powder of the electron transport layer material in the above range, it is possible to improve the uniformity of the powder of the electron transport layer material in the sol liquid. Moreover, by reducing the average particle diameter of the electron transport layer material, it is possible to increase the surface area (specific surface area) of the obtained electron transport layer 4. With this arrangement, the formation region of the dye layer D can be enlarged, which can contribute to the enhancement of the power generation efficiency of the solar cell 1A.

In the following an example of the formation method of the electron transport layer 4 will be described.

<Preparation of Titanium Oxide Powder (Powder of the Electron Transfer Layer Material)>

<3-A0> Powder of the rutile-type titanium dioxide and powder of the anatase-type titanium dioxide (including the cases of using exclusively the rutile-type or the anatase-type) are combined and mixed in advance at a prescribed combining ratio.

In this case, the average particle diameters of the rutile-type and the anastase-type titanium dioxide powders may be different or equal, but it is preferable that they are different.

The average particle diameter of the titanium dioxide as a whole is in the range stated in the above.

<Preparation of Sol Liquid (Electron Transport Layer Material)>

<3-A1> First, one kind or a combination of two or more kinds of organic titanium compounds such as titanium alkoxides (e.g. titanium tetraisopropoxide (TPT), titanium tetramethoxide, titanium tetraethoxide, and titanium tetrabutoxide), and titanium oxyacetyl acetonate (TOA), or an inorganic titanium compound such as titanium tetrachloride (TTC) are dissolved in an organic solvent such as ethanol abhydride, 2-butanol, 2-propanol or 2-n-butoxyethanol or a mixed solvent of these, to obtain a solution.

In this case, the concentration of the organic titanium compounds or the inorganic titanium compounds in the solution is not particularly limited, but it is preferable that it is about 0.1 to 3 mol/L.

Next, various kinds of additive are added to the solution as needed. When a titanium alkoxide, for example, is used as the organic titanium compound, an additive such as acetic acid, acetylacetone or nitric acid is added because the titanium alkoxide is chemically unstable. By so doing, it is possible to make the alkoxide chemically stable. In this case, the combining ratio of the additive and the titanium alkoxide is not limited particularly, but it is preferable that it is about 1:2 to 8:1 in molar ratio.

<3-A2> Next, water such as distilled water, ultra-pure water, ion-exchanged water or RO water is added to the solution. The combining ratio of the water and the organic or inorganic titanium compound is preferable to be about 1:4 to 4:1 in molar ratio.

<3-A3> Then, the titanium oxide powder prepared in the process <3-A0> is mixed with the solution in the above to obtain a suspended (dispersed) liquid.

<3-A4> Further, the suspension is diluted with an organic solvent or a mixed solvent in the above to prepare a sol liquid. The dilution factor is preferable to be about 1.2 to 3.5, for example.

Although the content of the titanium oxide powder (powder of the electron transport layer material) in the sol liquid is not limited particularly, but it is preferable that it is about 0.1 to 10 wt %, and more preferably 0.5 to 5 wt %. This makes it possible to satisfactorily set the porosity of the electron transport layer 4 within the range stated above.

<Formation of the Electron Transfer Layer (Titanium Oxide Layer) 4>

<3-A5> The sol liquid is coated on the top face of the barrier layer 8 by a coating method (e.g. dripping or the like), preferably while heating the layer 8, to obtain a film-like body (coating film). The heating temperature is not limited particularly, but it is preferable that it is about 80 to 180° C., and more preferably about 100 to 160° C.

The operation in the above is repeated preferably for about 1 to 10 times, and more preferably for about 5 to 7 times to form the electron transport layer 4 with the average thickness described above.

Then, the electron transport layer 4 may be subjected to a heat treatment such as sintering as needed. The conditions of the heat treatment are, for example, at a temperature of about 250 to 500° C. and for about 0.5 to 3 hours.

<3-A6> The electron transport layer 4 obtained in the previous process <3-A5> may be subjected to post-treatments as needed.

As the post-treatments, mechanical processing such as grinding and polishing and other treatment such as cleaning and chemical treatment may be mentioned.

Moreover, the electron transport layer 4 may be formed, for example, in the following manner. Hereinbelow, a description will be made with regard to the post-treatment. In this connection, it should be noted that the following description is focused to the differences from the above formation method, and similar matters are omitted.

<Preparation of Titanium Oxide Powder (Powder of Electron Transfer Layer Material)>

<3-B0> A process similar to the above process <3-A0> is performed.

<Preparation of Coating Liquid (Electron Transfer Layer Material)>

<3-B1> First, an appropriate amount of titanium oxide powder prepared in the above process is suspended in water. Examples of the water for this purpose include distilled water, ultra-pure water, ion-exchanged water or RO water.

<3-B2> Next, a stabilizer such as nitric acid is added to the suspension, and the mixture is thoroughly kneaded in a mortar made of agate or alumina.

<3-B3> Then, water in the above is added to the above suspension and kneaded further. In this case, the combining ratio of the stabilizer and water is preferably about 10:90 to 40:60 in volume ratio, and more preferably about 15:85 to 30:70, and the viscosity of the suspension is made about 0.2 to 30 cP (at normal temperature).

<3-B4> After that, a surfactant is added to the suspension so as to obtain a final concentration of about 0.01 to 5 wt %, and the suspension is kneaded. In this way, a coating liquid (electron transfer layer material) is prepared.

Although the surfactant may be any type of cationic, anionic, amphoteric or nonionic, it is preferable to use a nonionic one.

Moreover, as the stabilizer, a surface modifying reagent of titanium oxide such as acetic acid or acetylacetone may be used in place of nitric acid.

Moreover, various kinds of additive such as a binder like a polyethylene glycol, a plasticizer and an antioxidant may be added as necessary to the coating liquid (electron transfer layer material)

<Formation of Electron Transport Layer (Titanium Oxide Layer) 4>

<3-B5> The coating liquid is coated on the top face of the first electrode 3 by a coating method such as dipping and dried to form a film-like body (coating film). The operation of coating and drying may be repeated for plural times to obtain a laminate. In this way, the electron transport layer 4 is obtained.

Next, the electron transport layer 4 may be subjected to a heat treatment such as sintering depending upon the need. The conditions of the heat treatment is set, for example, at a temperature of about 250 to 500° C. and for a duration of about 0.5 to 3 hours. As a result, the particles of the powder of titanium oxide which have so far been merely in mutual contact start to diffuse in their contact sites, and the particles of the powder of titanium oxide begin to be immobilized (fixed). In this state, the electron transport layer is converted to a porous layer.

<3-B6> A process similar to the above process <3-A6> is carried out.

By going through the above processes, the electron transport layer 4 is obtained.

<4> Then, the electron transport layer 4 and the liquid containing a dye as described above are brought into contact by, for example, dipping or coating. By so doing, the dye layer D is formed by allowing the dye to be adsorbed or bonded to the outer faces of the electron transport layer 4 and on the inner surface of the holes 41. As for the liquid containing the dye, a solution in which the dye is dissolved or a suspension suspending the dye can be mentioned.

Specifically, by dipping the laminate of the substrate 2, the first electrode 3, the barrier layer 8 and the electron transport layer 4 into the liquid containing the dye, it is possible to easily form the dye layer D on the outer faces and on the inner surface of the holes 41.

Although the solvent (liquid) for dissolving or suspending (dispersing) the dye is not particularly limited, various kinds of water, methanol, ethanol, isopropyl alcohol, acetonitrile, ethyl acetate, ether, methylene chloride, NMP (N-methyl-2-pyrrolidone) or the like may be mentioned, and one kind or a combination of two or more kinds of these may be used.

After this, the laminate is taken out of the solution or the suspension, and the solvent is removed by natural drying or a method of blowing a gas such as air or nitrogen gas at the laminate or the like.

Besides, the laminate may be dried in a clean oven or the like at a temperature of about 60 to 100° C. for about 0.5 to 2 hours as needed. With this process, it is possible to let the dye adsorbed or bonded to the electron transport layer 4 more firmly.

<5> Next, the hole transport layer 5 is formed on the top face of the dye layer D (the electron transport layer 4 formed with the dye layer D).

It is preferable that the hole transport layer 5 is formed by coating a hole transport layer material (electrode material) containing a substance having ion conductive property such as CuI on the top face of the electron transport layer 4 formed with the dye layer D by a coating method such as dipping, dripping, doctor blading, spin coating, brushing, spraying or roll coating.

Using such a coating method, it is possible to form the hole transport layer 5 so as to infiltrate more surely into the holes 41 of the electron transport layer 4 formed with the dye layer D.

Moreover, after the formation of the coating film, the coating film may be subjected to a heat treatment. However, the coating of the hole transport layer material to the top face of the electron transport layer 4 formed with the dye layer D is preferable to be carried out while heating the dye layer D (the electron transport layer formed with the dye layer D). This arrangement is advantageous for forming the hole transport layer 5 more quickly, that is, for shortening the manufacturing time of the solar cell 1A.

In this case, it is preferred that the temperature of the heating is set to be about 50 to 150° C. When subjecting the sample to a heat treatment after formation of the coating film, drying of the coating film may be given before the heat treatment.

The above operation may be repeated for two or more times.

Specifically, the laminate of the substrate 2, the first electrode 3, the barrier layer 8 and the electron transport layer 4 formed with the dye layer D is placed on a hot plate heated to about 80° C. In this state, the hole transport layer material is dripped onto the top face of the electron transport layer 4 formed with the dye layer D, and then it is dried. This operation is repeated for two or more times to form the hole transport layer 5 with the average thickness as mentioned above.

The solvent to be used for the hole transport layer material is not particularly limited, but an organic solvent such as acetonitrile, ethanol, methanol and isopropyl alcohol, various kinds of water or the like may be used, and one kind or a combination of two or more kinds of these may be used.

As the solvent for dissolving a substance having ion conductive property, acetonitrile can be preferably used.

Moreover, when CuI is employed as a substance having ion conductive property (ion conductivity), it is preferable to add cyanoethylate such as a cyano resin in the acetonitrile solution of CuI as a binder of CuI. In this case, it is preferred that the amount of the cyanoethylate with respect to CuI is in the range of the weight ratio of 5 to 0.5 wt %.

Moreover, it is preferable that the hole transport layer material contain a substance which enhances the transport efficiency of the holes. When such a substance is included in the hole transport layer material, the carrier mobility in the hole transport layer 5 becomes higher due to enhancement of ion conductivity. As a result, the electrical conductivity at the hole transport layer 5 is enhanced.

Such a substance for enhancing the transport efficiency of the holes (hole transport efficiency enhancing substance) is not particularly limited, but a halide such as ammonium halide, for example, may be used, and the use of an ammonium halide such as tetrapropyl-ammonium iodide (TPAI) is especially preferable. By the use of tetrapropyl-ammonium iodide, the carrier mobility of the substance having ion conductive property is enhanced further. With this result, the electrical conductivity of the hole transport layer 5 is further enhanced.

The content of the substance for enhancing the transport efficiency of the holes in the hole transport layer material is not particularly limited to a specific value, but it should preferably lie in the range of $1\times10^{-4}$ to $1\times10^{-1}$ wt %, and more preferably lie in the range of $1\times10^{-4}$ to $1\times10^{-2}$ wt %. If the content is in the range mentioned above, the above described effect becomes further conspicuous.

Furthermore, in the case where the hole transport layer 5 is formed of a material containing the substance having the ion conductive property as its main constituent, it is preferred that the hole transport layer material contains a crystal size coarse suppressing substance which suppresses the increase in the crystal size when the substance having the ion conductive property crystallizes, which has the following effect.

The crystal size coarse suppressing substance is not particularly limited to a specific one, and it may include thiocyanic acid salt (rhodanide) besides the cyanoethylate and the hole transport efficiency enhancing substance mentioned above. Further, one kind or a combination of two or more kinds of these substances may be used as the crystal size coarse suppressing substance.

Examples of the thiocyanic acid salt include sodium thiocyanate (NaSCN), potassium thiocyanate (KSCN), copper thiocyanate (CuSCN), ammonium thiocyanate (NH4SCN), and the like.

When the hole transport efficiency enhancing substance is used as the crystal size coarse suppressing substance, the ammonium halide is particularly preferable. Among hole transport efficiency enhancing substances, the ammonium halide has an especially excellent function that suppresses the increase in the crystal size of the substance having the ion conductive property.

Here, if the hole transport layer material does not contain such a crystal size coarse suppressing substance, its crystal size may become too large upon crystallization of the substance having the ion conductive property depending on the kind of the substance having the ion conductive property, heating temperature or the like, which may result in the case that the volume expansion proceeds exceedingly. In particular, if crystallization takes place within the holes (minute pores) of the barrier layer 8, cracks may develop in the barrier layer 8, and as a result, it may lead to local short-circuiting due to partial contact or the like between hole transport layer 5 and the first electrode 3.

Further, if the crystal size of the substance having the ion conductive property becomes large, there is a case that contact with the electron transport layer formed with the dye layer D becomes poor depending on the kind of the substance having the ion conductive property or the like. As a result, there is a case that the substance having the ion conductive property, that is the hole transport layer 5 is peeled off from the electron transport layer 4 formed with the dye layer D.

For these reasons, in these solar cells there is a case that a device performance such as photoelectric conversion efficiency is lowered.

In contrast, if the hole transport layer material contains such a crystal size coarse suppressing substance, the increase in the crystal size of the substance having the ion conductive property is suppressed and its crystal size remains to be relatively small.

For example, when thiocyanic acid salt is added into an acetonitrile solution of CuI, thiocyanic ions (SCN—) are adsorbed to the Cu atoms in CuI which is dissolved in a saturated state, and Cu—S(Sulfor) bonding occurs. This prevents bonding of CuI molecules dissolved in a saturated state, so that the crystal growth of the CuI can be prevented, thereby enabling to obtain a finely grown CuI crystal.

As described above, according to the solar cell 1A, inconveniences derived from the coarse of the crystal grain size of the substance having the ion conductive property can be suppressed appropriately.

The content of the crystal size coarse suppressing substance in the hole transport layer material is not particularly limited, and it is preferable that it is about $1 \times 10^{-6}$ to 10 wt %, and more preferably about $1 \times 10^{-4}$ to $10^{-2}$ wt %. Within such a range of the numerical value, the effect described in the above becomes more conspicuous.

Furthermore, when the hole transport layer 5 is formed of a p-type semiconductor material, the hole transport layer material is prepared by dissolving or suspending the p-type semiconductor material in various kinds of organic solvent such as acetone, isopropyl alcohol (IPA) or ethanol or a mixed solvent containing these. Using such a hole transport layer material, the hole transport layer 5 is formed in a manner similar to the above.

<6>Next, the second electrode 6 is formed on the top face of the hole transport layer 5.

The second electrode 6 may be formed of a material composed of platinum or the like by using evaporation method, sputtering method, printing method or the like.

The solar cell 1A can be manufactured according to the processes described in the above.

Next, another method of manufacturing the solar cell 1A will be described.

Figure 7:
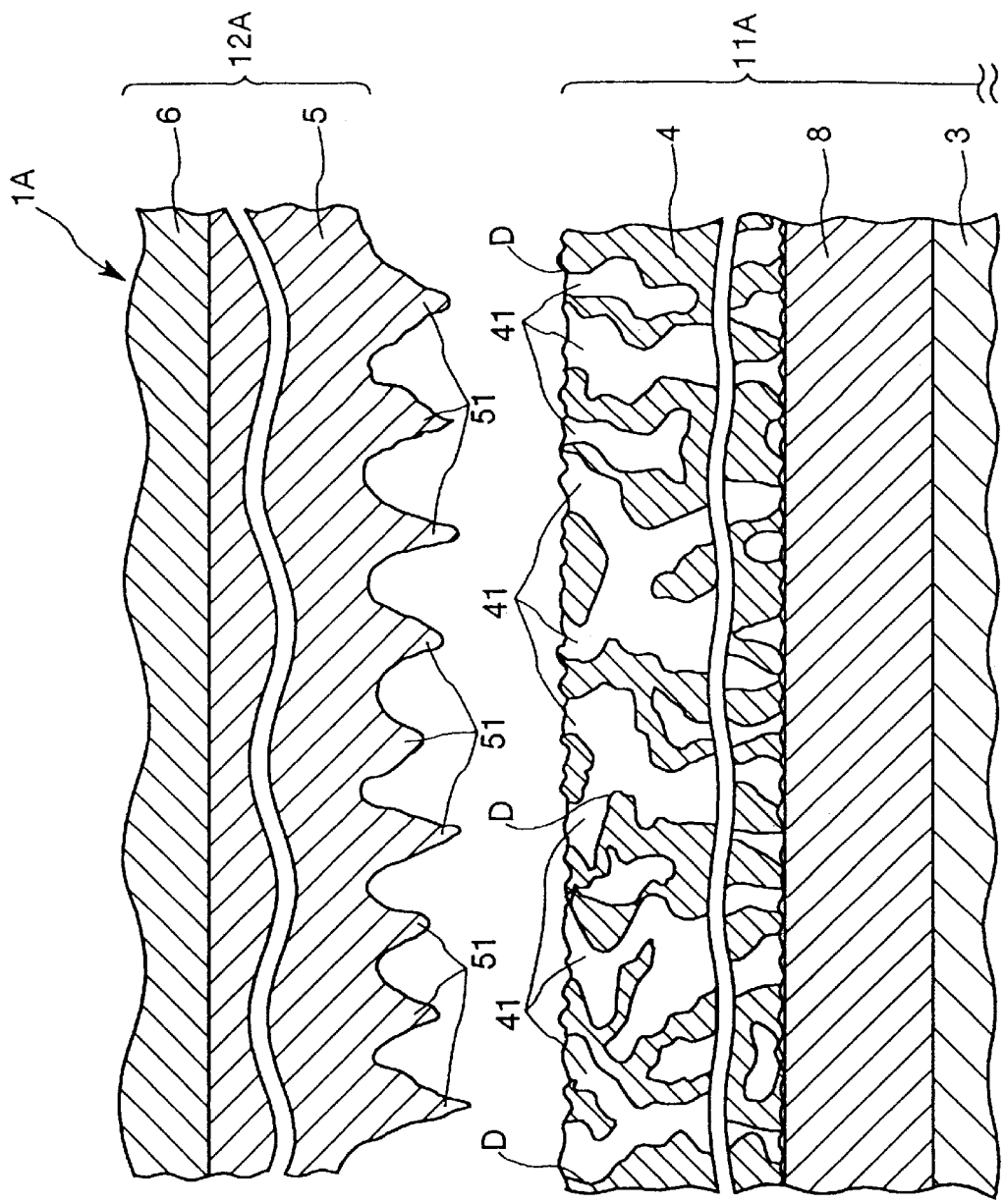
FIG. 7 is an illustration for explaining other manufacturing method of the solar cell of the first embodiment (that is, an enlarged cross sectional view which shows a state before the electron transport layer formed with the dye layer and the hole transport layer are joined).

FIG. 7 is a diagram illustrating another method for manufacturing the solar cell according to the first embodiment (enlarged sectional view showing the state before joining the electron transport layer formed with the dye layer D and the hole transport layer). In this connection, it should be noted that in the following description the upper side and the lower side of each layer (member) in FIG. 7 will be referred to as a top face and a bottom face, respectively.

Further, in the following, a description will be made by focusing to the differences from the manufacturing method in the above, and description about similar matters will be omitted.

In this method, the solar cell 1A is manufactured by joining a laminate 12A in which the hole transport layer material is coated on the bottom face of the second electrode 6, and a laminate 11A of the substrate 2, the first electrode 3 and the electron transport layer 4 formed with the dye layer D so that the dye layer D is brought into contact with the coating of the hole transport layer material, as shown in FIG. 7.

<1'> to <4'> Processes similar to the above processes <1> to <4> are carried out. As a result, the laminate 11A is obtained.

<5'> On the other hand, a hole transport layer material is coated on one face of the second electrode 6 composed of, for example, platinum.

This process can be carried out similarly to the above process <5>. In this case, heat treatment of the coating is omitted, so that the coating of the hole transport layer material is in an unsolidified state. In this way, the laminate 12A is obtained.

In the following, the hole transport layer material with the coating in an unsolidified state will be called as the hole transport layer 5.

In this case, there are formed a plurality of projections 51 on the bottom face of the hole transport layer 5, so that the bottom face is in a rugged state.

<6'> Next, the laminate 11A and the laminate 12A are joined so that the dye layer D is brought into contact with the hole transport layer 5.

Here, it should be understood that in a solar cell with no provision of the barrier layer 8, when the porosity of the electron transport layer 4 is made large, there is a case that the hole transport layer 5 intrudes by caving into the holes 41 of the electron transport layer 4 formed with the dye layer D with each projection 51 at the front. Further, the hole transport layer 5 penetrates the electron transport layer 4 formed with the dye layer D, thus resulting in a case that nearly all of the projections 51 make contact with the first electrode 3. As a result, such a solar cell has a large leakage current, and its power generation efficiency deteriorates.

In contrast, in the solar cell 1A provided with the barrier layer 8 which is a short-circuit preventing means, when the laminate 12A is made to approach the laminate 11A, the hole transport layer 5 also proceeds to cave in the electron transport layer 4 formed wit the dye layer D to the holes 41 with the projections 51 at the front. However, as soon as the hole transport layer 5 reaches the barrier layer 8, it is prevented by the barrier layer 8 from making further approach to the first electrode 3.

Moreover, by joining the hole transport layer 5 so as to make it cave in the holes 41 of the electron transport layer 4 formed with the dye layer D, it is possible to sufficiently increase the contact area of the hole transport layer 5 with the dye layer D. As a result, the transmission of the holes generated in the dye layer D to the hole transport layer 5 can be done more efficiently.

Accordingly, such a solar cell 1A can prevent or suppress the leakage current, and its power generation efficiency can be improved.

Second Embodiment

Next, a second embodiment of the solar cell will be described.

FIG. 8 is a sectional view showing the solar cell of the second embodiment, and FIG. 9 is a diagram for describing the method of manufacturing the solar cell of the second embodiment (enlarged sectional view before joining the electron transport layer formed with the dye layer D with the hole transport layer). In this connection, it should be noted that in the following description the upper side and the lower side of each layer (member) in FIG. 8 and FIG. 9 will be referred to as a top face and a bottom face, respectively.

Further, in the following, a solar cell 1B shown in FIG. 8 will be described by focusing to the differences from the first embodiment, and description about similar matters will be omitted.

The solar cell 1B of the second embodiment has the same structure as that of the solar cell 1A of the first embodiment excepting that a spacer is provided as a short-circuit preventing means instead of the barrier layer.

Namely, between the first electrode 3 and the second electrode 6, a spacer 7 is arranged so as to surround the electron transport layer 4 formed with the dye layer D and the hole transport layer 5.

The spacer 7 is provided for regulating the space between the first electrode 3 and the hole transport layer 5, that is, to hold the space between them constant.

Such a spacer 7 is formed of an insulating material. The insulating material is not particularly limited, but a photosetting resin such as a UV-curing resin, a heatsetting resin such as an epoxy resin may be mentioned, and one kind or a combination of two or more kinds of these may be used.

Here, the spacer 7 need not have a constitution to cover the electron transport layer 4 formed with the dye layer D and the hole transport layer 5, and may be given a constitution in which spherical bodies, bar-like bodies or the like are disposed around these layers, so long as it can regulate the space between the first electrode 3 and the hole transport layer 5. The bar-like body may have a circular, elliptical, or polygonal, such as triangular, rectangular, or the like, sectional form.

The solar cell 1B may be formed by almost the same manufacturing processes (see another manufacturing method of the first embodiment) for the first solar cell 1A of the first embodiment. In this case, in the final process, a laminate 11B consisting of the substrate 2, the first electrode 3, the electron transport layer 4 formed with the dye layer D and the spacer 7, and a laminate 12B consisting of a coating of a hole transport layer material (the hole transport layer 5) and the second electrode 6 are joined so that the dye layer D is brought into contact with the coating of the hole transport layer material.

Here, in a solar cell where the spacer 7 is not provided, when the porosity of the electron transport layer 4 is increased, the hole transport layer 5 intrudes so as to cave into the holes 41 of the electron transport layer 4 formed with the dye layer D with the projections 51 at the front. Further, the hole transport layer 5 then penetrates the electron transport layer 4 formed with the dye layer D, thus leading to a case that almost all of the projections 51 make contact with the first electrode 3. As a result, such a solar cell has a large leakage current, and its power generation efficiency is deteriorated.

In contrast, since the solar cell 1B is provided with the spacer 7 which is a short-circuit preventing means, when the laminate 11B is made to approach the laminate 12B, the hole transport layer 5 also intrudes into the electron transport layer 4 formed with the dye layer D so as to cause the projections 51 to cave in the holes 41. However, as soon as the top face of the spacer 7 and the bottom face of the second electrode 6 abut on with each other, further approach between the laminate 11B and the laminate 12B is blocked. At this time, the hole transport layer 5 is in a state in which it has caved in sufficiently to the electron transport layer 4 formed with the dye layer D, namely, in a sufficiently penetrated state.

The average thickness of the spacer 7 (length H in FIG. 9) is set at a size so that the hole transport layer 5 (projection 51) does not make contact with the first electrode 3.

With such an arrangement, in the solar cell 1B, the contact of the hole transport layer 5 with the first electrode 3 is prevented or suppressed. As a result, in such a solar cell 1B, the leakage current is prevented or suppressed, and its power generation efficiency is improved.

From such a viewpoint, it is preferred that the average thickness H of the spacer 7, the maximum thickness (h1 in FIG. 9) of the hole transport layer 5 and the maximum thickness (h2 in FIG. 9) of the sum of the thicknesses of the electron transport layer 4 and the dye layer D (thickness of the electron transport layer with formed dye layer D) satisfy the condition $h1+h2>H \geq h1$, and more preferably $1.1\, h1 \geq H \geq h1$. By restricting the average thickness H of the spacer 7 in the above range, it is possible to satisfactorily prevent or suppress the short-circuiting due to electrical contact or the like between the electrode 3 and the hole transport layer 5. Moreover, with this arrangement, the contact area between the hole transport layer 5 and the dye layer D can be secured sufficiently.

In this embodiment, it is also possible to enhance the effect in the above by providing a barrier layer, similar to the barrier layer 8 described in the first embodiment, to the lower part of the electron transport layer 4, namely, between the electron transport layer 4 and the first electrode 3.

In the above, the solar cell according to the present invention has been described based on each illustrated embodiment, but the invention is not limited to these structures. Each part constituting the solar cell may be replaced by a part of an arbitrary constitution that can exhibit similar function.

The solar cell according to the present invention may be one obtained by a combination of arbitrary two or more constitutions among the first and second embodiments.

Moreover, the photoelectric conversion device according to the present invention is applicable not only to the solar cell, but also to various kinds of devices (light receiving devices), such as an optical sensor and an optical switch, that convert received optical energy into electrical energy.

Furthermore, in the photoelectric conversion device according to the present invention, the light incidence direction, which with the surface of the semiconductor forms the angle of incidence, defined as the angle between the direction of the light and the surface of the semiconductor, may be in the opposite direction, different from that shown in the figures, that is, their light incidence direction maybe arbitrary.

EXAMPLES

Hereinbelow, a description will be made with regard to the actual examples of the present invention.

Example 1

A solar cell (photoelectric conversion element) shown in FIG. 1 was manufactured as follows.

(0) First, a soda glass substrate having the size of 30 mm (length)×35 mm (width)×1.0 mm (thickness) was prepared. Then, this soda glass substrate was subjected to cleaning by immersing it into a cleaning solution (a mixed solution of sulfuric acid and hydrogen peroxide to clean its surface.

(1) Next, an electrode made of FTO (first electrode) having the size of 30 mm (length)×35 mm (width)×1.0 mm (thickness) was formed on the top surface of the soda glass substrate by means of deposition.

(2) Next, a barrier layer was formed on the region of the FTO electrode having the size of 30 mm (length)×30 mm (width). This barrier layer was formed as follows.

<Preparation of Barrier Layer Material>

First, titanium tetraisopropoxide (organic titanium compound) was dissolved in an organic solvent of 2-n-butoxyethanol solution so that its concentration be 0.5 mol/L to obtain a solution.

Then, diethanolamine (additive) was added to the solution so that the combining ratio between the diethanolamine and the titanium tetraisopropoxide was 2:1 in molar ratio.

In this way, a barrier layer material was obtained. In this case, the viscosity of the barrier layer material was 3 Cp (at a room temperature).

<Formation of Barrier Layer>

The barrier layer material was coated onto the FTO electrode by means of spin coating (one of coating methods) to obtain a coating. The spin coating was carried out through a rotation speed of 1500 rpm.

Then, a laminate comprised of the soda glass substrate, the FTO electrode and the coating was placed on a hot plate, and it was subjected to a heat treatment at a temperature of 160° C. for 10 minutes, thereby drying the coating.

Thereafter, the laminate was subjected to another heat treatment in an oven at a temperature of 480° C. for 30 minutes to remove the organic component remaining in the coating.

These operations were repeated for ten times to form a laminate of the barrier layer material.

In this way, a barrier layer having a porosity of less than 1% was obtained. The average thickness of the barrier layer was 0.9 $\mu$m.

(3) Next, a titanium oxide layer (which is an electron transport layer) was formed on the entire of the top face of the barrier layer. This was carried out as follows.

<Preparation of Powder of Titanium Oxide>

A powder of titanium oxide comprised of a mixture of rutile-type titanium dioxide and anatase-type titanium dioxide was prepared. In this case, the average particle diameter of the titanium oxide powder was 40 nm, and the mixing ratio of the rutile-type titanium dioxide with respect to the anatase-type titanium dioxide was 60:40 in weight.

<Preparation of Sol liquid (Titanium Oxide Layer Material)>

First, titanium tetraisopropoxide (TPT) was dissolved in an organic solvent of 2-propanol so that its concentration be 1 mol/L to obtain a solution.

Then, acetic acid (additive) and distilled water were added to the solution. In this case, the combining ratio between the acetic acid and the titanium tetraisopropoxide was 1:1 in molar ratio and the combining ratio between the distilled water and the titanium tetraisopropoxide was 1:1 in molar ratio.

Thereafter, the prepared titanium oxide powder was mixed in this solution. Then, this suspended liquid was diluted with 2-propanol by two times. In this way, a sol liquid, that is a titanium oxide layer material was prepared.

Formation of Titanium Oxide Layer

Next, the laminate comprised of the soda glass substrate, the FTO electrode and the barrier layer was placed on a hot plate which was being heated at a temperature of 140° C., and in this state the sol liquid (which is a titanium oxide layer material) was dropped (one of the coating methods) on the top surface of the barrier layer, and then it was dried. This operation was repeated for seven times to form a laminate.

In this way, a titanium oxide layer having a porosity of 34% was obtained. In this case, the average thickness of the titanium oxide layer was 7.2 $\mu$m.

Further, the resistance value in the thickness direction of the total of the barrier layer and the titanium oxide layer was equal to or greater than 1 k$\Omega$/cm$^2$.

(4) Next, the laminate comprised of the soda glass substrate, the FTO electrode, the barrier layer and the titanium oxide layer was immersed into a saturated ethanol solution of rutenium tris(bipyridyl) (organic dye). Thereafter, the laminate was taken out from the ethanol solution, and then it was naturally dried to volatilize the ethanol. Further, this laminate was dried by a clean oven at a temperature of 80° C. for 0.5 hour, and then it was being left for one night. In this way, a dye layer D was formed onto the outer surfaces of the titanium oxide layer as well as the inner surfaces of the holes thereof.

(5) Next, the laminate comprised of the soda glass substrate, the FTO electrode, the barrier layer and the titanium oxide layer formed with the dye layer D was placed on a hot plate which was being heated at a temperature of 80° C., and in this state an acetonitrile solution of CuI (which is a hole transport layer material) was dropped on the top surface of the titanium oxide layer formed with the dye layer D, and then it was dried. This operation was repeated to form a laminate so that a CuI layer (which is a hole transport layer) having the size of 30 mm (length)× 35 mm (width)×30 $\mu$m (thickness) was formed.

In this case, tetrapropyl-ammonium iodide was added to the acetonitrile solution as a hole transport efficiency enhancing substance so that its content be 1×10$^{-3}$ wt %.

Further, in the acetonitrile solution, a cyano resin (cyanoethylate) was added as a binder for CuI so that the weight ratio of the CuI with respect to the cyano resin is 97:3.

Furthermore, in the acetonitrile solution, sodium thiocyanate (NaSCN) was added as a crystal size coarse suppressing substance so that its content be 1×10$^{-3}$ wt %.

(6) Next, a platinum electrode (which is a second electrode) having the size of 30 mm (length)×35 mm (width)×0.1 mm (thickness) was formed on the top surface of the CuI layer by means of deposition.

Example 2

A solar cell was manufactured in the same manner as the Example 1 excepting that the operation for forming the barrier layer was repeated twice using barrier layer materials of different compositions.

<Preparation of Barrier Layer Material>

First, titanium tetrachloride (which is an inorganic titanium compound) was dissolved in ethanol anhydride so that its concentration be 1.0 mol/L.

In this way, a barrier layer material was obtained. In this case, the viscosity of the obtained barrier layer material was 0.9 cP (at a room temperature).

Further, the porosity of the obtained barrier layer was less than 1%, and the average thickness thereof was 2.1 $\mu$m.

On the other hand, the porosity of the titanium oxide layer (electron transport layer) was 35%, and the average thickness thereof was 7.4 $\mu$m.

Further, the resistance value in the thickness direction of the total of the barrier layer and the titanium oxide layer was equal to or greater than 1 k$\Omega$/cm$^2$.

Example 3

A solar cell was manufactured in the same manner as the Example 1 excepting that the operation for forming the barrier layer was repeated for three times using barrier layer materials of different compositions.

<Preparation of Barrier Layer Material>

First, titanium oxyacetonate (which is an organic titanium compound) was dissolved in 2-butanol so that its concentration be 1.5 mol/L.

In this way, a barrier layer material was obtained. In this case, the viscosity of the obtained barrier layer material was 1.3 cP (at a room temperature).

Further, the porosity of the obtained barrier layer was less than 1%, and the average thickness thereof was 3.1 µm.

On the other hand, the porosity of the titanium oxide layer (electron transport layer) was 33%, and the average thickness thereof was 6.9 µm.

Further, the resistance value in the thickness direction of the total of the barrier layer and the titanium oxide layer was equal to or greater than 1 kΩ/cm$^2$.

Example 4

A solar cell was manufactured in the same manner as the Example 1 excepting that the operation for forming the barrier layer was repeated for five times using barrier layer materials of different compositions.

<Preparation of Barrier Layer Material>

First, titanium tetraisopropoxide (TPT) was dissolved in an organic solvent of 2-propanol so that its concentration be 2.0 mol/L to obtain a solution.

Then, acetic acid (additive) was added to the solution so that the combining ratio between the acetic acid and the titanium tetraisopropoxide was 1:1 in molar ratio.

In this way, a barrier layer material was obtained. In this case, the viscosity of the obtained barrier layer material was 1.9 cP (at a room temperature).

Further, the porosity of the obtained barrier layer was less than 1%, and the average thickness thereof was 4.7 µm.

On the other hand, the porosity of the titanium oxide layer (electron transport layer) was 35%, and the average thickness thereof was 7.3 µm.

Further, the resistance value in the thickness direction of the total of the barrier layer and the titanium oxide layer was equal to or greater than 1 kΩ/cm$^2$.

Example 5

A solar cell (photoelectric conversion element) shown in FIG. 8 which was equipped with a spacer instead of the barrier layer was manufactured in the same manner as the Example 1.

(0')(1') The processes which were same as the processes (0) and (1) of the Example 1 were carried out.

(2') Next, a titanium oxide layer (which is an electron transport layer) was formed on the region having the size of 30 mm×30 mm in the top face of the formed FTO electrode. This was carried out as is the same with the process (3) of the Example 1.

In this way, a titanium oxide layer having a porosity of 36% was obtained. In this case, the resistance value in the thickness direction of the total of the barrier layer and the titanium oxide layer was equal to or greater than 20 kΩ/cm$^2$.

(3') Next, a dye layer D was formed onto the outer surfaces of the titanium oxide layer as well as the inner surfaces of the holes thereof. This was carried out as is the same with the process (4) of the Example 1. The maximum thickness of the total of the titanium oxide layer and the dye layer was 10.1 µm.

(4') Next, outer peripheral portions of the titanium oxide layer formed with the dye layer was surrounded by an epoxy resin (a material of a spacer), and then it was hardened.

In this way, a laminate comprised of the soda glass substrate, the FTO electrode, the titanium oxide layer formed with the dye layer and the spacer was obtained. In this case, the average thickness of the laminate was 31.1 µm.

(5') Next, on a region in one surface of a platinum electrode (which is a second electrode) having the size of 30 mm×30 mm, an acetonitrile solution of CuI (which is a hole transport layer material) was applied. This was carried out as is the same with the process (5) of the Example 1, but the heat treatment was omitted.

In this way, a laminate comprised of the platinum electrode and the CuI coating (CuI layer) was obtained. In this case, the maximum thickness of the CuI layer was 29.6 µm.

Next, these laminates were joined so that the dye layer was brought into contact with the CuI layer.

Comparative Example 1

A solar cell was manufactured in the same manner as the Example 1 excepting that the barrier layer (short-circuit preventing means) was omitted and that the titanium oxide layer (electron transport layer) was manufactured as follows.

<Preparation of Powder of Titanium Oxide>

A powder of titanium oxide comprised of a mixture of rutile-type titanium dioxide and anatase-type titanium dioxide was prepared. In this case, the average particle diameter of the titanium oxide powder was 1.2 µm, and the mixing ratio of the rutile-type titanium dioxide with respect to the anatase-type titanium dioxide was 60:40 in weight.

<Preparation of Sol liquid (Titanium Oxide Layer Material)>

First, the prepared titanium oxide powder of 50 g was added to a distilled water of 100 mL.

Then, nitric acid (which is a stabilizer) was added to the suspension, and the mixture was thoroughly kneaded in a mortar made of agate.

Thereafter, distilled water of 100 mL was added to the suspension and then it was further kneaded. In this case, the amount of the added distilled water was determined so that the final ratio of the nitric acid with respect to the water became 20:80 in volume ratio. At this time, the viscosity of the suspension was 5 cP (at a room temperature).

Next, a nonionic surfactant (produced by ICN Biomedical Co., Ltd. Under the product name of "Triton-X 100") was added to the suspension so that the final concentration be about 10 wt %, and then the suspension was kneaded. In this way, a coating liquid (titanium oxide layer material) was prepared.

<Formation of Titanium Oxide Layer>

Next, on a region in one surface of the FTO electrode having the size of 30 mm×30 mm, the titanium oxide layer material was applied by dipping (one of the coating methods), and then it was subjected to sintering (heat treatment) at a temperature of 450° C. for two hours.

In this way, a titanium oxide layer having a porosity of 91% was obtained. In this case, the average thickness of the titanium oxide layer was 9.9 µm. Further, the resistance value in the thickness direction of the titanium oxide layer was 20 kΩ/cm$^2$.

Comparative Example 2

A solar cell was manufactured in the same manner as the Example 1 excepting that the titanium oxide layer (electron transport layer) was omitted.

<Formation of Barrier Layer>

The operation for forming the barrier layer in the Example 1 was repeatedly carried out against a region on the top surface of the FTO electrode having the size of 30 mm×30 mm.

In this way, a barrier layer having a porosity of less than 1% was obtained. In this case, the average thickness of the barrier layer was 10.2 µm.

Further, in this barrier layer, rutile-type titanium dioxide and anatase-type titanium dioxide were existed with the ratio of 65:35. Furthermore, the resistance value in the thickness direction of the barrier layer was equal to or greater than 1 kΩ/cm².

Evaluation 1

For each of the solar cells provided by the Examples 1 to 5 and the Comparative Examples 1 and 2, a resistance value when a voltage of 0.5V was applied in the state that the FTO electrode was positive and the platinum electrode was negative was measured.

Evaluation 2

For each of the solar cells provided by the Examples 1 to 5 and the Comparative Examples 1 and 2, a photoelectrical conversion efficiency at the time when light from an artificial sun light was incident thereupon was measured. In this case, the angle of incidence of light on the dye layer D (the electron transport layer formed with the dye layer) was set to 90° and 52°, and the photoelectric conversion efficiency for each of the angles of incidence of light on the dye layer of 90° and 52° (which are respectively an angle defined between the direction of the light and the surface of the semiconductor) was designated by $R_{90}$ and $R_{52}$, respectively.

The results of the measurements in the evaluations 1 and 2 were shown in the attached Table 1.

As seen from the results shown in the Table 1, in each of the solar cells of the Examples 1 to 5 which have the short-circuit preventing means (that is, the barrier layer or spacer), it has been confirmed that a short-circuit caused by contact or the like between the FTO electrode and the CuI layer was satisfactorily prevented or suppressed, so that it had an excellent photoelectric conversion efficiency.

In contrast, in each of the solar cells of the Comparative Examples 1 and 2 in which either one of the barrier layer (short-circuit preventing means) or the titanium oxide layer (electron transport layer) was omitted, it has been confirmed that their photoelectric conversion efficiencies were poor.

The reason that the photoelectric conversion efficiency of the Comparative Example 1 was poor was supposed to result from the occurrence of the leakage current due to the short-circuiting (electrical contact) between the FTO electrode and the CuI electrode as apparent from the results of the evaluation 1.

Further, the reason that the photoelectric conversion efficiency of the Comparative Example 2 was poor was supposed to result from the facts that the porosity of the barrier layer was low and that the amount of the adsorption of the rutenium tris(bipyridyl) was little due to the low porosity.

Further, in each of the solar cells of the Examples 1 to 5, the value of $R_{52}/R_{90}$ and $R_{52}$ was equal to or greater than 0.85. This shows that each of these solar cells of the Examples 1 to 5 had a lower directivity for light.

As described above, since the present invention is provided with the short-circuit preventing means, it is possible to effectively prevent or suppress occurrence of short-circuit caused by electrical contact between the first electrode and the hole transport layer and thereby to generate electrons with high efficiency, so that extremely excellent photoelectric conversion efficiency can be accomplished.

Further, in the present invention, by using the sol-gel method employing a sol liquid containing powder of the electron transport layer material, it is possible to form an electron transport layer more easily and reliably.

Furthermore, in the present invention, by using the MOD method in providing the barrier layer as the short-circuit preventing means, it is possible to form a barrier layer more easily and reliably. Moreover, the photoelectric conversion element of the present invention can be manufactured easily at a low cost.

Finally, it is to be understood that the present invention is not limited to the embodiments and examples described above, and many changes or additions may be made without departing from the scope of the invention which is determined by the following claims.

TABLE 1

| | Barrier Layer | | Titanium Oxide Layer (Electron Transport Layer) | | | Results of Evaluation 2 | | |
|---|---|---|---|---|---|---|---|---|
| | Average | | Average | | Results of Evaluation 1 | (Photoelectric Conversion Efficiency) | | |
| | Thickness [μm] | Porosity [%] | Thickness [μm] | Porosity [%] | (Resistance Value) [Ω/cm²] | $R_{90}$ [%] | $R_{52}$ [%] | $R_{52}/R_{90}$ |
| Example 1 | 0.9 | less than 1 | 7.2 | 34 | equal to or greater than 1000 | 4.5 | 3.9 | 0.87 |
| Example 2 | 2.1 | less than 1 | 7.4 | 35 | equal to or greater than 1000 | 3.5 | 3.1 | 0.89 |
| Example 3 | 3.1 | less than 1 | 6.9 | 33 | equal to or greater than 1000 | 4.0 | 3.5 | 0.88 |
| Example 4 | 4.7 | less than 1 | 7.3 | 35 | equal to or greater than 1000 | 3.5 | 3.0 | 0.86 |
| Example 5 | Spacer is used instead of barrier layer | | 10.1* | 36 | equal to or greater than 1000 | 3.8 | 3.4 | 0.89 |
| Comp. Ex. 1 | — | | 9.9 | 91 | 20 | 0 | 0 | — |
| Comp. Ex. 2 | 10.2 | less than 1 | — | | equal to or greater than 1000 | 0.1 | 0.1 | — |

*The maximum thickness of the titanium oxide layer (electron tronsportlayer) formed with the dye layer.

What is claimed is:

1. A photoelectric conversion element, comprising:
   a first electrode;
   a second electrode arranged opposite to the first electrode;
   an electron transport layer arranged between the first electrode and the second electrode, at least a part of the electron transport layer being porous;
   a dye layer which is in contact with the electron transport layer;
   a hole transport layer arranged between the electron transport layer and the second electrode; and short-circuit preventing moans, adjacent the first electrode, that prevents or suppresses a short-circuit between the first electrode and the hole transport layer; the short-circuit preventing means including a barrier layer having a porosity smaller than the porosity of the electron transport layer, wherein when the porosity of the barrier layer is defined by A% and the porosity of the electron transport layer is defined by B%, the value of B/A is equal to or greater than 10.

2. The photoelectric conversion element as claimed in claim 1, wherein the porosity of the barrier layer is equal to or less than 2%.

3. The photoelectric conversion element as claimed in claim 1, wherein the ratio of the thickness of the barrier layer with respect to the thickness of the electron transport layer is in the range of 1:99 to 60:40.

4. The photoelectric conversion element as claimed in claim 1, wherein the average thickness of the barrier layer is in the range of 0.01 to 10 $\mu$m.

5. The photoelectric conversion element as claimed in claim 1, wherein the barrier layer lies electric conductivity which is substantially the same as that of the electron transport layer.

6. The photoelectric conversion element as claimed in claim 1, wherein the barrier layer mainly comprises titanium oxide.

7. The photoelectric conversion element as claimed in claim 1, wherein the barrier layer is formed by means of a MOD method comprising a metal organic deposition or a metal organic decomposition.

8. The photoelectric conversion element as claimed in claim 7, wherein the barrier layer is formed using a barrier layer material when the barrier layer is formed by means of the MOD method, in which the barrier layer material contains a metal alkoxide and an additive having a function for stabilizing the metal alkoxide.

9. The photoelectric conversion element as claimed in claim 8, wherein the additive is a hydrolysis suppressing agent that suppresses hydrolysis of the metal alkoxide.

10. The photoelectric conversion element as claimed in claim 1, wherein the resistance value in the thickness direction of the total of the barrier layer and the electron transport layer is equal to or greater than 100 k$\Omega$/cm$^2$.

11. The photoelectric conversion element as claimed in claim 1, wherein the barrier layer is disposed between the first electrode and the electron transport layer.

12. The photoelectric conversion element as claimed in claim 11, wherein the boundary between the barrier layer and the electron transport layer is unclear.

13. The photoelectric conversion element as claimed in claim 11, wherein the barrier layer and the electron transport layer are integrally formed with each other.

14. The photoelectric conversion element as claimed in claim 1, wherein apart of the electron transport layer functions as the barrier layer.

15. The photoelectric conversion element as claimed in claim 1, wherein the short-circuit preventing means is a spacer which defines a space between the first electrode and the hole transport layer.

16. The photoelectric conversion element as claimed in claim 15, wherein when the average thickness of the spacer is defined by H $\mu$m, the maximum thickness of the hole transport layer is defined by h1 $\mu$m, and the total thickness of the electron transfer layer and the dye layer is defined by h2 $\mu$m, and the thicknesses are configured so as to satisfy the relationship represented by the formula of h1+h2>H$\geq$h1.

17. The photoelectric conversion element as claimed in claim 1, wherein the dye layer functions as a light receiving layer which generates electrons and holes when receiving light.

18. The photoelectric conversion element as claimed in claim 1, wherein the electron transport layer has an outer surface and a number of holes each having an inner surface, and the dye layer is formed on the outer surface of the electron transport layer as well as along the inner surfaces of the holes.

19. The photoelectric conversion element as claimed in claim 17, wherein the electron transport layer has at least a function that transports the electrons generated in the dye layer.

20. The photoelectric conversion element as claimed in claim 1, wherein the electron transport layer is formed into a film shape.

21. The photoelectric conversion element as claimed in claim 16, wherein the average thickness of the electron transport layer is in the range of 0.1 to 300 $\mu$m.

22. The photoelectric conversion element as claimed in claim 1, wherein the porosity of the electron transport layer is in the range of 5 to 90%.

23. The photoelectric conversion element as claimed in claim 1, wherein at least a part of the electron transport layer is formed of an electron transport layer material in the form, of powder having an average particle size of 1 nm to 1 $\mu$m.

24. The photoelectric conversion element as claimed in claim 1, wherein at least a part of the electron transport layer is formed of an electron transport layer material by means of a sol-gel method employing a sol liquid containing powder having an avenge particle size of 1 nm to 1 $\mu$m.

25. The photoelectric conversion element as claimed in claim 24, wherein the content of the powder of the electron transport material in the sol liquid is in the range of 0.1 to 10 wt %.

26. The photoelectric conversion element as claimed in claim 1, wherein the electron transport layer is mainly formed of titanium dioxide.

27. The photoelectric conversion element as claimed in claim 1, wherein the hole transport layer comprises a substance having ion conductive property.

28. The photoelectric conversion element as claimed in claim 27, wherein the substance having the ion conductive property is a metal halide compound.

29. The photoelectric conversion element as claimed in claim 28, wherein the metal halide compound comprises a metal iodide compound.

30. The photoelectric conversion element as claimed in claim 27, wherein the hole transport layer is formed by applying the hole transport material comprising the substance having the ion conductive property onto the dye layer by means of a coating method.

31. The photoelectric conversion element as claimed in claim 30, wherein the hole transport layer is formed by applying the hole transport layer material onto the dye layer while the dye layer is being heated.

32. The photoelectric conversion element as claimed in claim 30, wherein the hole transport layer material contains a crystal size coarse suppressing substance which suppresses increase in the crystal size of the substance having the ion conductive property when the substance having the ion conductive property crystallizes.

33. The photoelectric conversion element as claimed in claim 32, wherein the content of the crystal size coarse suppressing substance in the hole transport layer material is in the range of 1×10$^{-1}$ to 10 wt %.

34. The photoelectric conversion element as claimed in claim 32, wherein the crystal size coarse suppressing substance comprises thiocyanic acid salt.

35. The photoelectric conversion element as claimed in claim 32, wherein the crystal size coarse suppressing substance comprises ammonium halide.

36. The photoelectric conversion element as claimed in claim 32, wherein the crystal size coarse suppressing substance comprises cyanoethylate.

37. The photoelectric conversion element as claimed in claim 32, wherein the substance having the ion conductive property is a metal halide compound including a metal iodide compound, in which the crystal size coarse suppressing substance suppresses the increase in the crystal size of the metal iodide compound when the metal iodide compound crystallizes by being bonded to the metallic atoms of the metal iodide compound.

38. The photoelectric conversion element as claimed in claim 30, wherein the hole transport layer material contains a hole transport efficiency enhancing substance that enhances the transport efficiency of the holes.

39. The photoelectric conversion element as claimed in claim 38, wherein the content of the hole transport efficiency enhancing substance in the hole transport layer material is in the range of $1 \times 10^{-4}$ to $1 \times 10^{-1}$ wt %.

40. The photoelectric conversion element as claimed in claim 38, wherein the bole transport efficiency enhancing substance includes a halide.

41. The photoelectric conversion element as claimed in claim 40, wherein the halide is ammonium halide.

42. The photoelectric conversion element as claimed in claim 1, further comprising a substrate for supporting the first electrode.

43. The photoelectric conversion element as claimed in claim 1, wherein when the first electrode and the second electrode are applied with a positive and a negative voltage, respectively, and when a voltage of 0.5V is applied across the electrodes, resistance in the photoelectric conversion element is larger than about 100 $\Omega/cm^2$.

44. The photoelectric conversion element as claimed in claim 1, wherein when the photoelectric conversion efficiency for an angle of incidence of light on the dye layer of 90° with respect to the surface and 52° (which are respectively an angle defined between the direction of the light and the surface of the semiconductor) are designated by $R_{90}$ and $R_{52}$, respectively, the ratio $R_{52}/R_{90}$ is larger than 0.8.

45. The photoelectric conversion element as claimed in claim 1, wherein the photoelectric conversion element is a solar cell.

* * * * *

UNITED STATES PATENT AND TRADEMARK OFFICE
CERTIFICATE OF CORRECTION

PATENT NO.     : 6,683,244 B2
DATED          : January 27, 2004
INVENTOR(S)    : Yuji Fujimori and Tsutomu Miyamoto It is certified that error appears in the above-identified patent and that said Letters Patent is hereby corrected as shown below:

Column 6,
Line 34, should read -- electron transfer layer 4, a hole transport layer 5, which is --.

Column 7,
Line 51, should read -- limited, but it is preferable that it is about 1 to 5μm --.

Column 11,
Line 56, should read -- thus leading to the case that the power generation efficiency, --.

Signed and Sealed this

Thirteenth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,683,244 B2
DATED : January 27, 2004
INVENTOR(S) : Yuji Fujimori and Tsutomu Miyamoto It is certified that error appears in the above-identified patent and that said Letters Patent is hereby corrected as shown below:

<u>Column 31,</u>
Line 1, should read -- short circuit preventing means, adjacent the first --.

Signed and Sealed this

Eleventh Day of January, 2005

JON W. DUDAS
*Director of the United States Patent and Trademark Office*